(12) United States Patent
Nishimura et al.

(10) Patent No.: US 12,532,401 B2
(45) Date of Patent: Jan. 20, 2026

(54) EUV LIGHT GENERATION SYSTEM AND ELECTRONIC DEVICE MANUFACTURING METHOD

(71) Applicant: Gigaphoton Inc., Tochigi (JP)

(72) Inventors: Yuichi Nishimura, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 130 days.

(21) Appl. No.: 18/327,814

(22) Filed: Jun. 1, 2023

(65) Prior Publication Data
US 2024/0023223 A1 Jan. 18, 2024

(30) Foreign Application Priority Data
Jul. 13, 2022 (JP) .................................. 2022-112655

(51) Int. Cl.
*H05G 2/00* (2006.01)
*G03F 7/00* (2006.01)
*G03F 7/20* (2006.01)

(52) U.S. Cl.
CPC ....... *H05G 2/0084* (2024.08); *G03F 7/70033* (2013.01); *G03F 7/7065* (2013.01); *H05G 2/0027* (2024.08); *H05G 2/0086* (2024.08); *H05G 2/0088* (2024.08)

(58) Field of Classification Search
CPC .... H05G 2/008; H05G 2/003; G03F 7/70033; G03F 7/7065
See application file for complete search history.

(56) References Cited

U.S. PATENT DOCUMENTS

| | | | |
|---|---|---|---|
| 9,778,022 B1 | 10/2017 | Odle et al. | |
| 10,057,972 B2 | 8/2018 | Jeno et al. | |
| 2010/0090133 A1* | 4/2010 | Endo ........................ | H05G 2/00 250/493.1 |

(Continued)

FOREIGN PATENT DOCUMENTS

JP H05-167162 A 7/1993

OTHER PUBLICATIONS

Search Report mailed by the Netherlands Patent Office on Aug. 11, 2025, which corresponds to Dutch Patent Application No. 2034994, and is related to U.S. Appl. No. 18/327,814, with English language Written Opinion.

*Primary Examiner* — Mesfin T Asfaw
(74) *Attorney, Agent, or Firm* — Studebaker Brackett PLLC

(57) ABSTRACT

An EUV light generation system includes a prepulse laser device outputting prepulse laser light to be radiated to a target supplied into a chamber; a main pulse laser device outputting main pulse laser light to be radiated to a diffusion target generated by the radiation of the prepulse laser light; a first actuator adjusting an irradiation position of the prepulse laser light; a second actuator adjusting an irradiation position of the main pulse laser light; an EUV sensor detecting EUV energy; a laser energy sensor detecting laser energy of the main pulse laser light; a target sensor imaging the diffusion target; and a controller controlling, after controlling the first actuator based on a characteristic value of the diffusion target calculated from an image of the diffusion target, the second actuator so that a ratio of the EUV energy to the laser energy detected by the laser energy sensor becomes large.

19 Claims, 22 Drawing Sheets

(56) References Cited

U.S. PATENT DOCUMENTS

2016/0202614 A1 7/2016 van der Burgt et al.
2020/0363729 A1 11/2020 Yanagida
2021/0410262 A1 12/2021 Takashima et al.

* cited by examiner

FIG. 7

| | | 1x [μm] | | | | | | |
|---|---|---|---|---|---|---|---|---|
| | | -30 | -20 | -10 | 0 | 10 | 20 | 30 |
| 1y [μm] | -30 | 1.74 | 3.53 | 4.69 | 6.82 | 7.63 | 7.15 | 5.58 |
| | -20 | 3.38 | 5.68 | 8.1 | 9.01 | 8.89 | 7.8 | 6.17 |
| | -10 | 5.22 | 7.99 | 9.35 | 9.51 | 9.4 | 8.38 | 6.38 |
| | 0 | 6.47 | 8.92 | 9.56 | 9.61 | 9.3 | 8.07 | 5.84 |
| | 10 | 6.87 | 8.08 | 8.98 | 9.42 | 9.26 | 8.39 | 5.79 |
| | 20 | 6.19 | 6.8 | 7.92 | 8.56 | 8.75 | 8.42 | 6.11 |
| | 30 | 5.36 | 5.35 | 6.73 | 8.32 | 8.36 | 8.46 | 6.64 |

FIG. 9
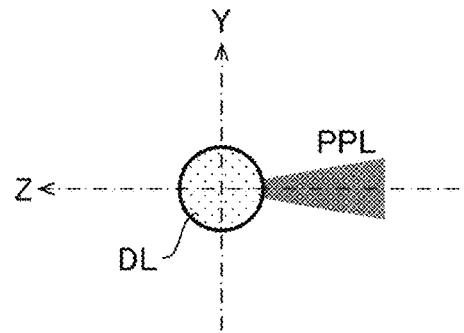
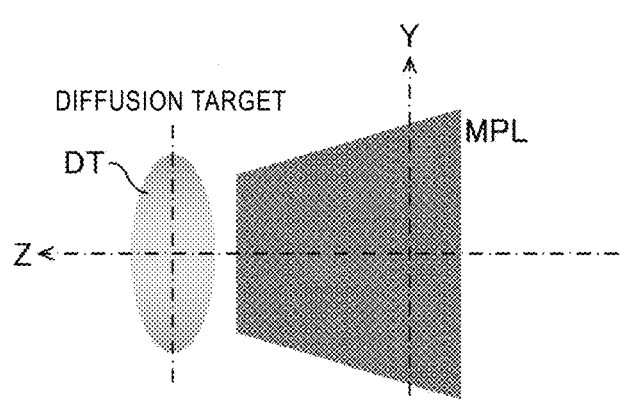
ANGLE: MINOR AXIS COINCIDES WITH LASER AXIS
POSITION: Z-DIRECTION DISTANCE IS MAXIMUM, NO Y-DIRECTION DEVIATION
DIAMETER: MAJOR AXIS IS MAXIMUM
DENSITY DISTRIBUTION: DENSE FROM INNER SIDE TO OUTER SIDE
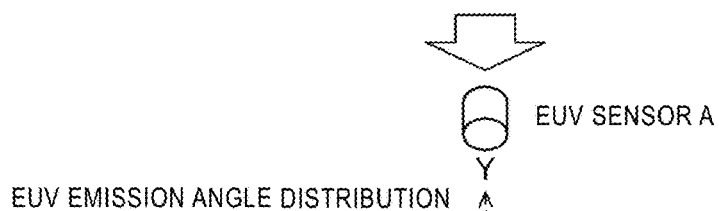
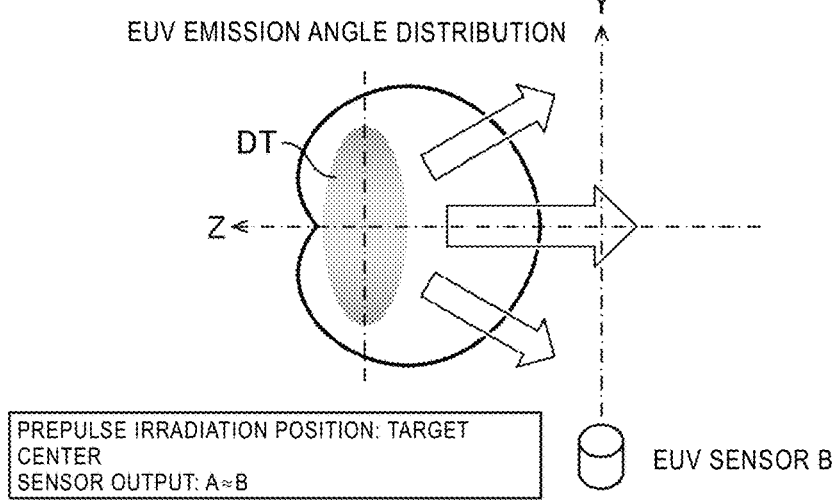
PREPULSE IRRADIATION POSITION: TARGET CENTER
SENSOR OUTPUT: A ≈ B FIG. 10
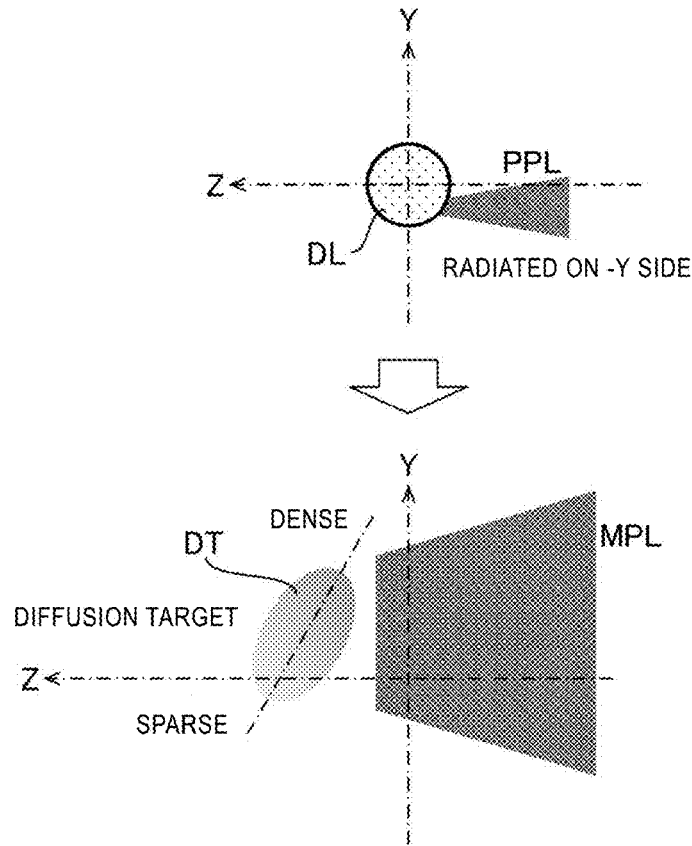
ANGLE: INCLINED TO -Y DIRECTION
POSITION: Z-DIRECTION DISTANCE DECREASED, Y-DIRECTION DEVIATION INCREASED
DIAMETER: MAJOR AXIS DECREASED
DENSITY DISTRIBUTION: DENSE PART DEVIATED IN +Y DIRECTION
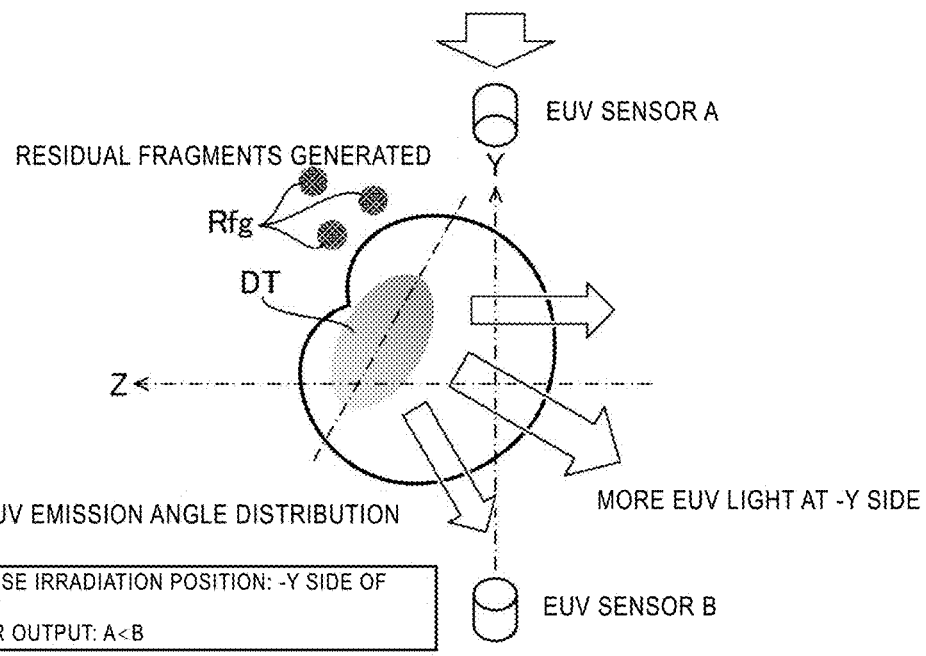

FIG. 11
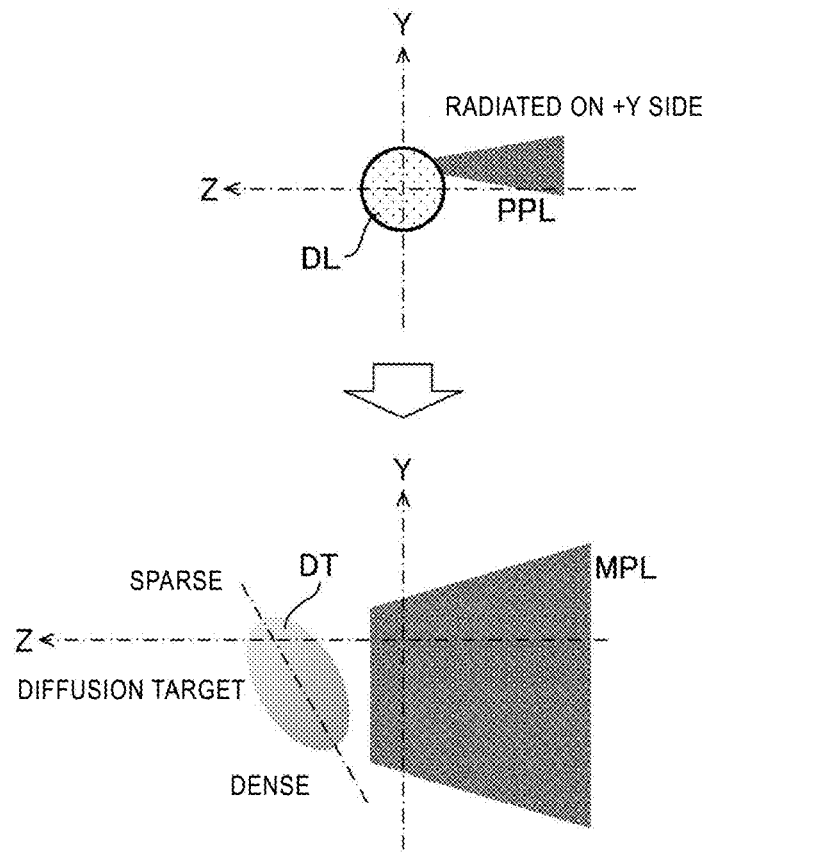
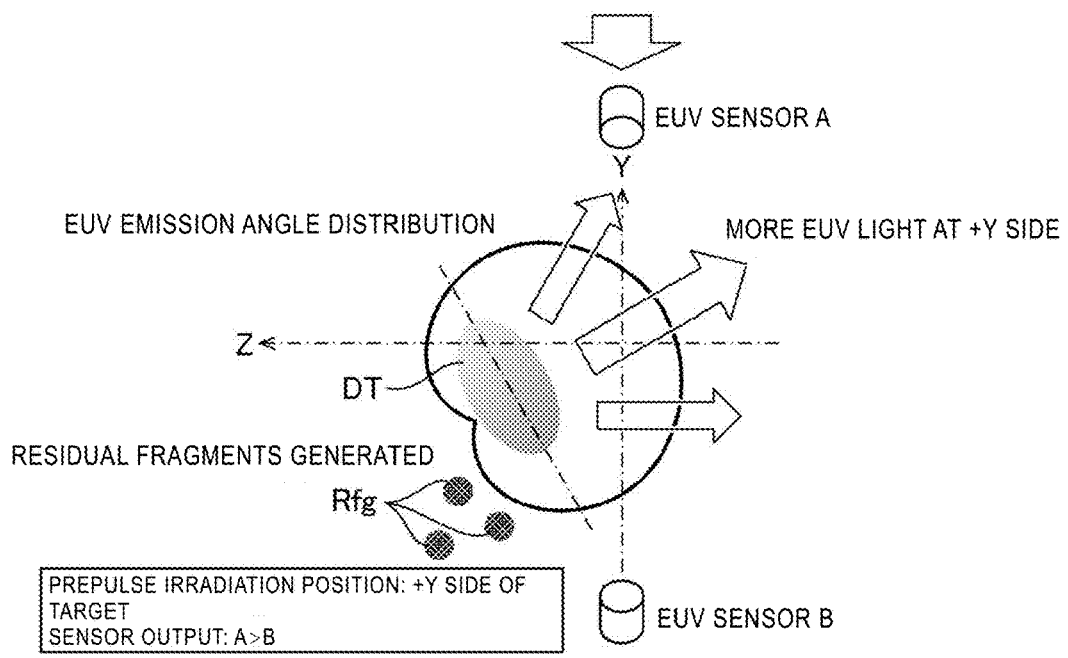

CASE OF |GRADIENT|>THRESHOLD T

CASE OF |GRADIENT|≤THRESHOLD T

EUV LIGHT GENERATION SYSTEM AND ELECTRONIC DEVICE MANUFACTURING METHOD

The present application claims the benefit of Japanese Patent Application No. 2022-112655, filed on Jul. 13, 2022, the entire contents of which are hereby incorporated by reference.

BACKGROUND

1. Technical Field

The present disclosure relates to an EUV light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. patent Ser. No. 10/057,972
Patent Document 2: U.S. Pat. No. 9,778,022
Patent Document 3: Japanese Patent Application Publication No. H5-167162

SUMMARY

An EUV light generation system according to an aspect of the present disclosure includes a prepulse laser device configured to output prepulse laser light to be radiated to a target supplied into a chamber; a main pulse laser device configured to output main pulse laser light to be radiated to a diffusion target generated by the radiation of the prepulse laser light; a first actuator configured to adjust an irradiation position of the prepulse laser light; a second actuator configured to adjust an irradiation position of the main pulse laser light independently from the irradiation position of the prepulse laser light; an EUV sensor configured to detect EUV energy of EUV light generated by the diffusion target being irradiated with the main pulse laser light; a laser energy sensor configured to detect laser energy of the main pulse laser light before being radiated to the diffusion target; a target sensor configured to image the diffusion target; and a controller configured to control, after controlling the first actuator based on a characteristic value of the diffusion target calculated from an image of the diffusion target obtained by the target sensor, the second actuator so that a ratio of the EUV energy to the laser energy detected by the laser energy sensor is increased.

An electronic device manufacturing method according to another aspect of the present disclosure includes generating EUV light using an EUV light generation system; outputting the EUV light to an exposure apparatus; and exposing a photosensitive substrate to the EUV light in the exposure apparatus to manufacture an electronic device. Here, the EUV light generation system includes a prepulse laser device configured to output prepulse laser light to be radiated to a target supplied into a chamber; a main pulse laser device configured to output main pulse laser light to be radiated to a diffusion target generated by the radiation of the prepulse laser light; a first actuator configured to adjust an irradiation position of the prepulse laser light; a second actuator configured to adjust an irradiation position of the main pulse laser light independently from the irradiation position of the prepulse laser light; n EUV sensor configured to detect EUV energy of the EUV light generated by the diffusion target being irradiated with the main pulse laser light; a laser energy sensor configured to detect laser energy of the main pulse laser light before being radiated to the diffusion target; a target sensor configured to image the diffusion target; and a controller configured to control, after controlling the first actuator based on a characteristic value of the diffusion target calculated from an image of the diffusion target obtained by the target sensor, the second actuator so that a ratio of the EUV energy to the laser energy detected by the laser energy sensor is increased.

A method of manufacturing an electronic device according to another aspect of the present disclosure includes generating EUV light using an EUV light generation system; inspecting a defect of a mask by irradiating the mask with the EUV light; selecting a mask using a result of the inspection; and exposing and transferring a pattern formed on the selected mask onto a photosensitive substrate. Here, the EUV light generation system includes a prepulse laser device configured to output prepulse laser light to be radiated to a target supplied into a chamber; a main pulse laser device configured to output main pulse laser light to be radiated to a diffusion target generated by the radiation of the prepulse laser light; a first actuator configured to adjust an irradiation position of the prepulse laser light; a second actuator configured to adjust an irradiation position of the main pulse laser light independently from the irradiation position of the prepulse laser light; an EUV sensor configured to detect EUV energy of the EUV light generated by the diffusion target being irradiated with the main pulse laser light; a laser energy sensor configured to detect laser energy of the main pulse laser light before being radiated to the diffusion target; a target sensor configured to image the diffusion target; and a controller configured to control, after controlling the first actuator based on a characteristic value of the diffusion target calculated from an image of the diffusion target obtained by the target sensor, the second actuator so that a ratio of the EUV energy to the laser energy detected by the laser energy sensor is increased.

BRIEF DESCRIPTION OF THE DRAWINGS

Embodiments of the present disclosure will be described below merely as examples with reference to the accompanying drawings.

FIG. 7 is a chart showing an exemplary EUV energy distribution chart created based on the irradiation position level groups shown in FIG. 6.

FIG. 9 is an explanatory diagram schematically showing a case in which the center of a droplet is irradiated with prepulse laser light.

FIG. 10 is an explanatory diagram schematically showing a case in which a position of the droplet shifted from the center in the −Y direction is irradiated with the prepulse laser light.

FIG. 11 is an explanatory diagram schematically showing a case in which a position of the droplet shifted from the center in the +Y direction is irradiated with the prepulse laser light.

DESCRIPTION OF EMBODIMENTS

Contents

Figure 1:
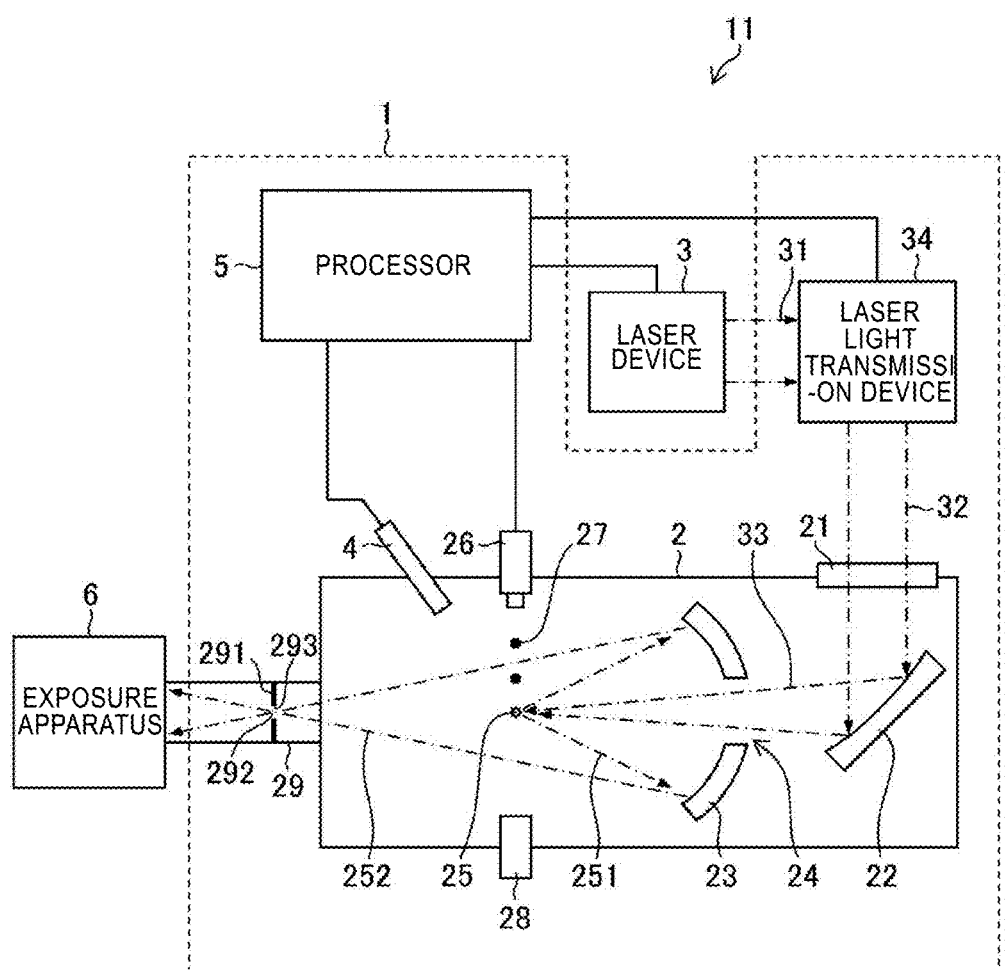
FIG. 1 schematically shows an exemplary configuration of an LPP EUV light generation system.

1. Description of terms
2. Overall description of EUV light generation system
   2.1 Configuration
   2.2 Operation
   2.3 Description of burst operation
3. Outline of EUV light generation system according to comparative example
   3.1 Configuration
   3.2 Operation
   3.3 Outline of initial adjustment
   3.4 Example of laser irradiation position adjustment process
      3.4.1 Outline of laser irradiation position adjustment process
      3.4.2 Description of flowchart
   3.5 Effect
   3.6 Problem
4. First embodiment
   4.1 Configuration
   4.2 Operation
      4.2.1 Observation example of diffusion target
      4.2.2 Timing chart of backlight observation
      4.2.3 Laser irradiation position adjustment
   4.3 Effect
5. Second embodiment
   5.1 Configuration
   5.2 Operation
   5.3 Effect
6. Third embodiment
   6.1 Phenomenon that droplet position varies
   6.2 Configuration
   6.3 Operation
   6.4 Effect
7. Fourth embodiment
   7.1 Configuration
   7.2 Operation
   7.3 Effect
8. Electronic device manufacturing method
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Description of Terms

A "target" is an object to be irradiated with laser light introduced into a chamber. The target irradiated with laser light is turned into plasma and emits EUV light.

A "droplet" is a form of a target supplied into the chamber. The droplet may refer to a droplet-shaped target having a substantially spherical shape due to surface tension of a molten target substance.

A "plasma generation region" is a predetermined region in the chamber. The plasma generation region is a region in which a target output into the chamber is irradiated with the laser light and in which the target is turned into plasma.

The expression "EUV light" is an abbreviation for "extreme ultraviolet light." An "extreme ultraviolet light generation system" is referred to as an "EUV light generation system."

2. Overall Description of EUV Light Generation System

2.1 Configuration

FIG. 1 schematically shows an exemplary configuration of an LPP EUV light generation system 11. An EUV light generation apparatus 1 is used with a laser device 3. In the present disclosure, a system including the EUV light generation apparatus 1 and the laser device 3 is referred to as the EUV light generation system 11. The EUV light generation apparatus 1 includes a chamber 2 and a target supply device 26. The chamber 2 is a sealable container. The target supply device 26 supplies a target substance into the chamber 2. The material of the target substance may include tin, terbium, gadolinium, lithium, xenon, indium, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The target sensor 4 detects at least one of the presence, trajectory, position, and velocity of the target 27. The target sensor 4 may have an imaging function.

Further, the EUV light generation apparatus 1 includes a connection portion 29 providing communication between the internal space of the chamber 2 and the internal space of the exposure apparatus 6. A wall 291 in which an aperture 293 is formed is provided in the connection portion 29. The wall 291 is arranged so that the aperture 293 is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

2.2 Operation

Operation of an exemplary LPP EUV light generation system 11 will be described with reference to FIG. 1. Pulse laser light 31 output from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply device 26 outputs the target 27 formed of a target substance toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light 252 contained in the radiation light 251 is selectively reflected by the EUV light concentrating mirror 23. The EUV light 252 reflected by the EUV light concentrating mirror 23 is concentrated at the intermediate focal point (IF) 292 and output to the exposure apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 may control timing at which the target 27 is output, an output direction of the target 27, and the like. Further, the processor 5 may control oscillation timing of the laser device 3, the travel direction of the pulse laser light 32, the concentration position of the pulse laser light 33, and the like. Such various kinds of control described above are merely exemplary, and other control may be added as necessary.

2.3 Description of Burst Operation

Figure 2:
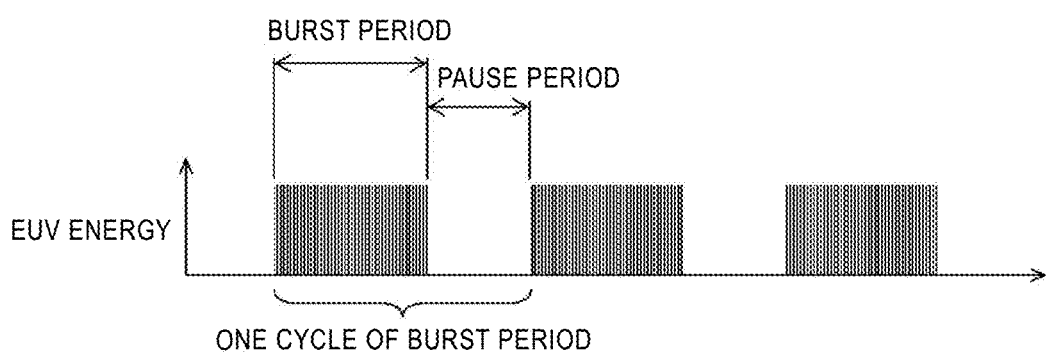
FIG. 2 is an explanatory diagram of burst operation.

FIG. 2 is an explanatory diagram of burst operation. In FIG. 2, the horizontal axis represents time, and the vertical axis represents EUV energy. The EUV light generation system 11 may output the EUV light 252 by the burst operation. The burst operation is an operation that repeats, at a predetermined repetition frequency, a burst period in which EUV light 252 is output for a specific period and a pause period in which EUV light is not output for a specific period.

During the burst period, the laser light is output. During the pause period, the output of the laser light is stopped or propagation of the laser light to the plasma generation region 25 is suppressed.

The burst pattern is defined by parameters including one or more of EUV energy in the burst period, the repetition frequency, the number of pulses, the length of the burst pause period, and the number of bursts. The burst pattern may be instructed by the exposure apparatus 6.

The duty (Duty) for the burst operation is a proportion of the burst period to one burst cycle (burst period+pause period), and is expressed by a percentage as in the following formula, for example.

$$\text{Duty }(\%) = \{\text{burst period}/(\text{burst period} + \text{pause period})\} \times 100(\%)$$

3. Outline of EUV Light Generation System According to Comparative Example

3.1 Configuration

Figure 3:
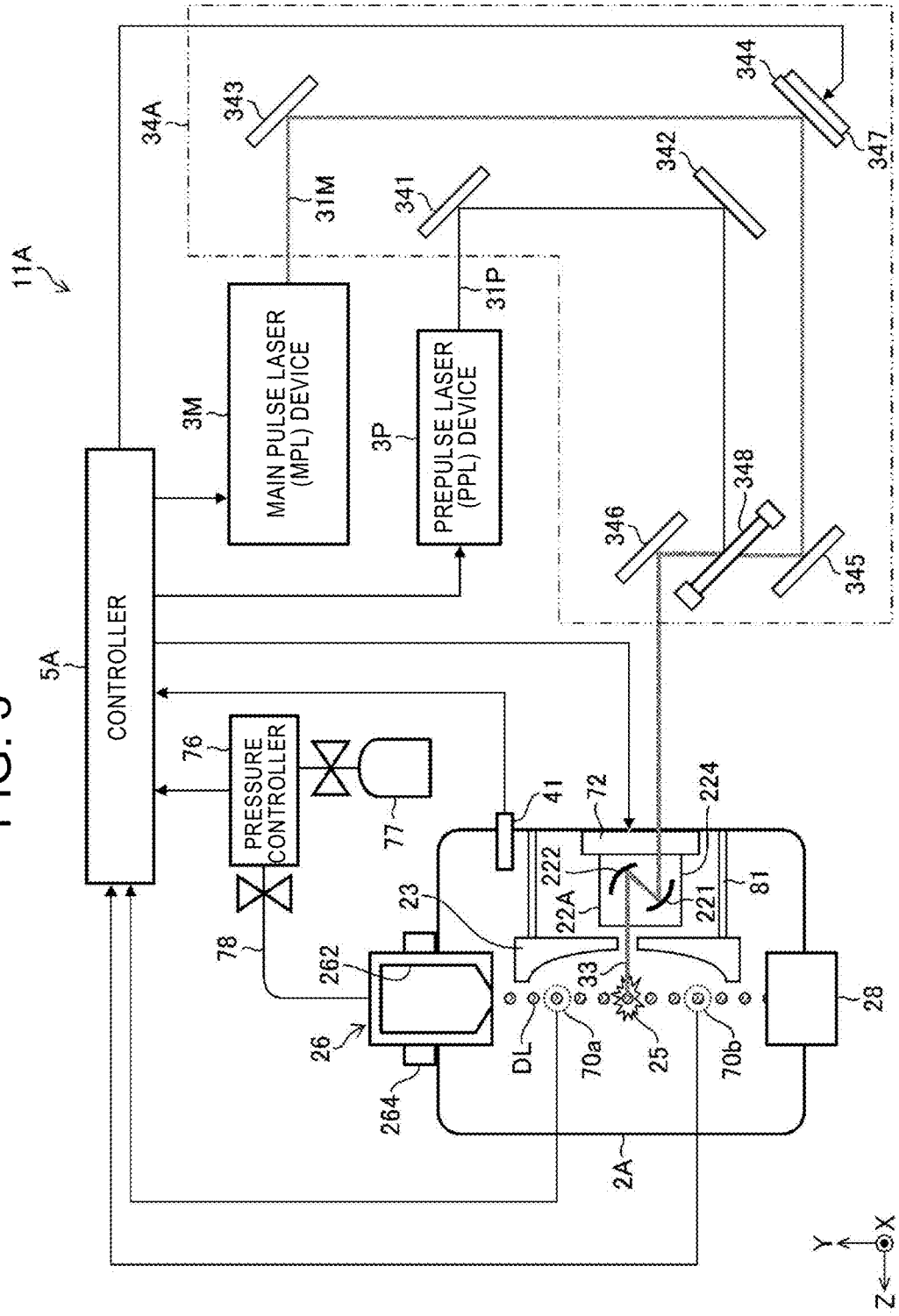
FIG. 3 schematically shows the configuration of an EUV light generation system according to a comparative example.

FIG. 3 schematically shows the configuration of an EUV light generation system 11A according to a comparative example. The comparative example of the present disclosure is an example recognized by the applicant as known only by the applicant, and is not a publicly known example admitted by the applicant.

The EUV light generation system 11A includes a chamber 2A, a target supply device 26, a timing sensor 41, a main pulse laser (MPL) device 3M, a prepulse laser (PPL) device 3P, a laser light transmission device 34A, a plurality of EUV sensors 70a, 70b, and a controller 5A. The EUV sensors 70a, 70b are arranged in the chamber 2A.

The target supply device 26 outputs the droplet DL as the target 27 into the chamber 2A. The target supply device 26 is arranged to penetrate a through hole formed in a wall of the chamber 2A. The target supply device 26 includes a tank 262 in which the molten target substance is stored, a nozzle which communicates with the tank 262 and outputs the target substance into the chamber 2A, and a piezoelectric element arranged near the nozzle. A heater and a temperature sensor are arranged on an outer wall surface portion of the tank 262, and the target substance in the tank 262 is heated by the heater to be melted.

The target supply device 26 is connected to a pressure controller 76 that adjusts the pressure of the tank 262. The pressure controller 76 is arranged at a pipe 78 between an inert gas supply unit 77 and the tank 262. The inert gas supply unit 77 may include a gas cylinder filled with inert gas such as helium or argon. The inert gas supply unit 77 can supply the inert gas into the tank 262 through the pressure controller 76. The pressure controller 76 includes a solenoid valve, a pressure sensor, and the like for supplying and exhausting of gas. The pressure controller 76 is connected to the controller 5A and adjusts the droplet output pressure of the target supply device 26. The molten target substance is ejected from the nozzle and vibrated by the piezoelectric element, thereby the droplet DL is generated.

Inside the chamber 2A, a light concentrating unit (focus unit: FU) 22A for irradiating the droplet DL supplied to the plasma generation region 25 with the concentrated laser light, a stage 72 for adjusting the position of the light concentrating unit 22A, an EUV light concentrating mirror 23, an EUV light concentrating mirror holder 81, and a target collection unit 28 are arranged.

The output direction of the EUV light 252 concentrated by the EUV light concentrating mirror 23 is defined as a positive direction (+Z direction) of the Z axis. As shown in FIG. 3, the travel direction of the pulse laser light 33 when the droplet DL supplied to the plasma generation region 25 is irradiated with the concentrated pulse laser light may be substantially the same as the +Z direction. The direction opposite to the output direction of the droplet DL output from the target supply device 26 is defined as the positive direction (+Y direction) of the Y axis. The droplet DL supplied into the chamber 2A travels in the −Y direction. A direction perpendicular to both the Z-axis direction and the Y-axis direction is defined as an X-axis direction.

The target supply device 26 is arranged at the chamber 2A via an XZ stage 264 movable in the X-axis direction and the Z-axis direction. The controller 5A controls the XZ stage 264 based on the output of the target sensor 4 (see FIG. 1). By controlling the XZ stage 264, the trajectory of the droplet DL can be adjusted so that the droplet DL passes through the plasma generation region 25.

The timing sensor 41 is a sensor that detects the droplet DL passing through the droplet detection region. The droplet detection region is a predetermined region in the chamber 2A, and is a region located at a predetermined position on the target trajectory between the target supply device 26 and the plasma generation region 25. The timing sensor 41 measures the passage timing of the droplet DL.

The prepulse laser device 3P is configured to output prepulse laser light 31P. The prepulse laser device 3P may be configured by, for example, a solid-state laser device using crystals doped with impurities in any of a medium YAG, YLF, YVO$_4$ or a CO$_2$ laser device. The main pulse laser device 3M is configured to output main pulse laser light 31M. The main pulse laser device 3M may be configured by, for example, a YAG laser device or a CO$_2$ laser device.

The laser light transmission device 34A includes high reflection mirrors 341 to 346, an actuator 347, and a combiner 348. The high reflection mirrors 341, 342 are arranged on an optical path of the prepulse laser light 31P.

The high reflection mirrors 343, 344, 345 are arranged on an optical path of the main pulse laser light 31M. The actuator 347 adjusts the position and/or angle of the high reflection mirror 344. Here, not limited to the high reflection mirror 344, the actuator 347 may be configured to adjust the position and/or angle of another high reflection mirror arranged on the optical path of the main pulse laser light 31M. The actuator 347 functions as means for adjusting the irradiation position of the main pulse laser light 31M. The actuator 347 arranged upstream of the combiner 348 can change the travel direction of the main pulse laser light 31M independently of the prepulse laser light 31P.

The combiner 348 is an optical element for combining the main pulse laser light 31M and the prepulse laser light 31P. The combiner 348 may be, for example, a dichroic mirror or a polarizer. The combiner 348 is located on the optical path of the prepulse laser light 31P reflected by the high reflection mirror 342. The combiner 348 is also located on the optical path of the main pulse laser light 31M reflected by the high reflection mirror 345. The combiner 348 is configured to reflect the prepulse laser light 31P at high reflectance and transmit the main pulse laser light 31M at high transmittance. The combiner 348 is configured to substantially match the optical path axes of the prepulse laser light 31P and the main pulse laser light 31M. That is, the optical paths of the prepulse laser light 31P and the main pulse laser light 31M are combined by the combiner 348. Alternatively, the combiner 348 may be configured to transmit the prepulse laser light 31P at high transmittance and reflect the main pulse laser light 31M at high reflectance, and the laser light transmission device 34A may be configured accordingly.

The high reflection mirror 346 is arranged on the optical path of the prepulse laser light 31P reflected by the combiner 348 and the optical path of the main pulse laser light 31M transmitted through the combiner 348. The high reflection mirror 346 is configured to reflect the prepulse laser light 31P and the main pulse laser light 31M toward the inside of the chamber 2A.

The light concentrating unit 22A is a unit including a light concentrating optical system which irradiates the droplet DL and a diffusion target to be described later with the concentrated pulse laser light 33. The light concentrating unit 22A includes laser light concentrating mirrors 221, 222. Each of the laser light concentrating mirrors 221, 222 is held by a mirror holder and fixed to a plate 224. The stage 72 includes an actuator capable of moving the plate 224 in mutually orthogonal directions of three axes of, for example, the X axis, the Y axis, and the Z axis. The stage 72 is configured to be capable of moving the irradiation position of the laser light within the chamber 2A in the directions of the respective axes of the X axis, the Y axis, and the Z axis to a position specified by the controller 5A.

The EUV light concentrating mirror 23 is held by the EUV light concentrating mirror holder 81. The EUV light concentrating mirror holder 81 is fixed to the chamber 2A.

The EUV sensors 70a, 70b are energy sensors that measure the energy of the generated EUV light 252. The EUV sensors 70a, 70b are arranged around the Z axis so as to surround the Z axis.

The controller 5A is connected to each of the prepulse laser device 3P, the main pulse laser device 3M, the actuator 347, the pressure controller 76, the target supply device 26, the XZ stage 264, the timing sensor 41, and the stage 72. In addition, the controller 5A mat be connected to an external device such as the exposure apparatus 6 or an inspection apparatus 661 to be described later. The controller 5A is configured including a processor. The processor in the present disclosure is a processing device including a storage device in which a control program is stored and a central processing unit (CPU) that executes the control program. The processor is specifically configured or programmed to perform various processes included in the present disclosure.

3.2 Operation

The controller 5A outputs a control signal to the target supply device 26. The target substance stored in the target supply device 26 is maintained at a temperature equal to or higher than the melting point of the target substance by a heater. The target substance in the target supply device 26 is pressurized by inert gas supplied into the target supply device 26 from the pressure controller 76. When the controller 5A increases the droplet output pressure by the pressure controller 76, the target substance pressurized by the inert gas is output from the nozzle as a jet. The jet of the target substance is separated into a plurality of droplets DL by vibrating components around the nozzle by the piezoelectric element.

The droplet DL output from the target supply device 26 into the chamber 2A moves along the target trajectory from the target supply device 26 to the plasma generation region 25 in the −Y direction. The droplet DL passes through the droplet detection region and is supplied to the plasma generation region 25. The droplet DL that has passed through the plasma generation region 25 is collected by the target collection unit 28.

The timing sensor 41 detects the timing at which the droplet DL has passed through the droplet detection region. The controller 5A receives the passage timing signal transmitted from the timing sensor 41.

The controller 5A measures the passage timing of the droplet DL at a predetermined position using the timing sensor 41, and controls the timing of outputting the prepulse laser light 31P from the prepulse laser device 3P based on the passage timing.

When the droplet DL reaches the position of the plasma generation region 25, the droplet DL is irradiated with the prepulse laser light 31P. Then, the droplet DL is broken to form a diffusion target including fine particles, micro droplets, and clusters.

The controller 5A irradiates the diffusion target with the main pulse laser light 31M to generate the EUV light 252. The timing of outputting the main pulse laser light 31M from the main pulse laser device 3M is also determined using the measurement result of the timing sensor 41. The generated EUV light 252 is reflected by the EUV light concentrating mirror 23 and is supplied to an external apparatus such as the exposure apparatus 6 or the inspection apparatus.

The controller 5A controls the stage 72 and the actuator 347 based on the output of the plurality of EUV sensors 70a, 70b at the time of initial adjustment, for example.

3.3 Outline of Initial Adjustment

The timing at which the initial adjustment is performed may be after maintenance of the EUV light generation apparatus 1, when the output of the EUV light 252 becomes lower than a desired value, or when a command for performance recovery is received from a user. Examples of the maintenance of the EUV light generation apparatus 1 may include replacement of the EUV light concentrating mirror 23, replacement of the target supply device 26, and replacement of a laser propagation system. The performance recovery command is a command for the user to request performance recovery.

In the initial adjustment, respective laser irradiation position adjustment mechanisms of the prepulse laser light 31P and the main pulse laser light 31M are adjusted based on the output of the EUV sensors 70a, 70b. The stage 72 in the EUV light generation apparatus 1 functions as the laser irradiation position adjustment mechanism of the prepulse laser light 31P. The actuator 347 in the EUV light generation apparatus 1 functions as the laser irradiation position adjustment mechanism of the main pulse laser light 31M.

Figure 4:
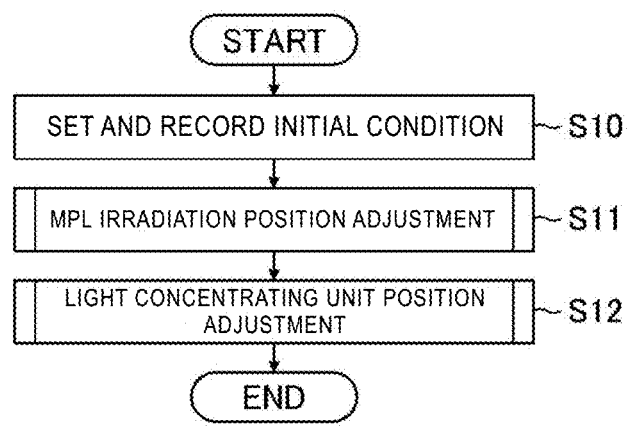
FIG. 4 is a flowchart of adjustment operation of a laser irradiation position performed in an initial adjustment.

FIG. 4 is a flowchart of adjustment operation of the laser irradiation position performed in the initial adjustment. In step S10, the controller 5A sets and records initial conditions. Specifically, as the setting of the initial conditions, a laser irradiation condition and a laser oscillation condition are set. The laser irradiation condition includes, for example, a delay time between the prepulse laser light 31P and the main pulse laser light 31M, prepulse energy, main pulse energy, a spot diameter D of the main pulse laser light 31M, and the like. The laser oscillation condition may be a value obtained by past data or experiments.

Further, the controller 5A sets an allowable value R of an irradiation position adjustment amount and records a current position $S_0(S_{MPL}, S_{FU})$ of the spot of the pulse laser light 33. $S_{MPL}$ indicates the irradiation position of the main pulse laser light 31M and corresponds to the position of the actuator 347. $S_{FU}$ indicates the irradiation position of the prepulse laser light 31P and corresponds to the position of the stage 72 of the light concentrating unit 22A. Hereinafter, the irradiation position of the main pulse laser light 31M may be referred to as an "MPL irradiation position", and the irradiation position of the prepulse laser light 31P may be referred to as a "PPL irradiation position."

The allowable value R of the laser irradiation position adjustment amount may satisfy, for example, $R=D/20$ or $D/20 \leq R \leq D/4$, where D is the spot diameter of the main pulse laser light 31M concentrated by the light concentrating unit 22A.

In step S11 after step S10, the controller 5A performs MPL irradiation position adjustment. Thereafter, in step S12, the controller 5A performs position adjustment of the light concentrating unit 22A. That is, the controller 5A first adjusts the MPL irradiation position that contributes highly to EUV emission. Therefore, a common laser irradiation position adjustment subroutine (see FIG. 5) is sequentially performed in each of adjustment steps in the order of the MPL irradiation position adjustment (step S11) and the light concentrating unit position adjustment (step S12). Here, the actuator 347 is used to adjust the MPL irradiation position, and the stage 72 is used to adjust the light concentrating unit position. By such a process of the initial adjustment, the respective irradiation positions are determined in the order of an optimum irradiation position $Sa_{MPL}$ of the MPL and an optimum position $Sa_{FU}$ of the light concentrating unit.

3.4 Example of Laser Irradiation Position Adjustment Process

Figure 5:
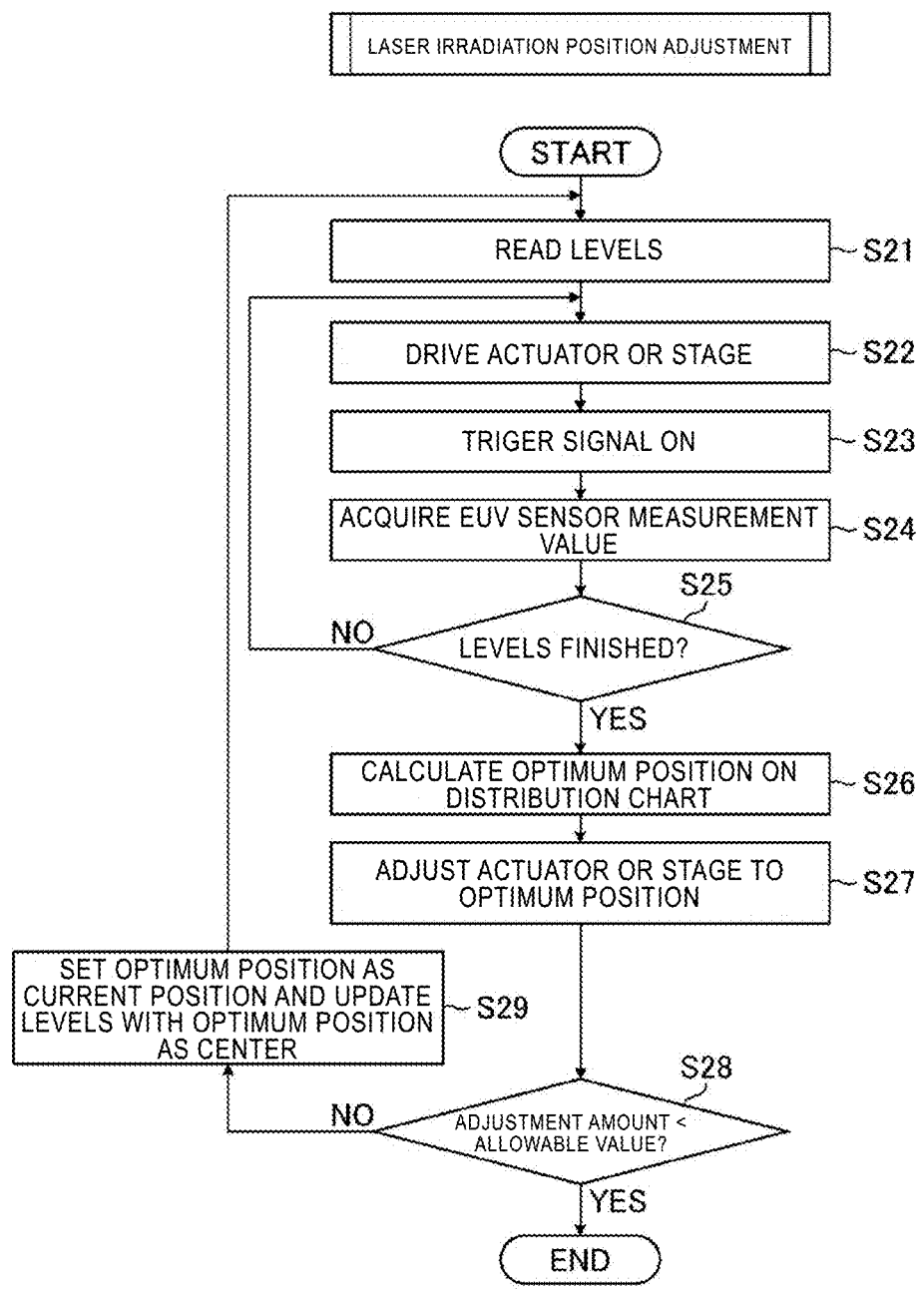
FIG. 5 is a flowchart showing an example of a laser irradiation position adjustment process applied to each of steps S11 and S12 of FIG. 4.
Figure 6:
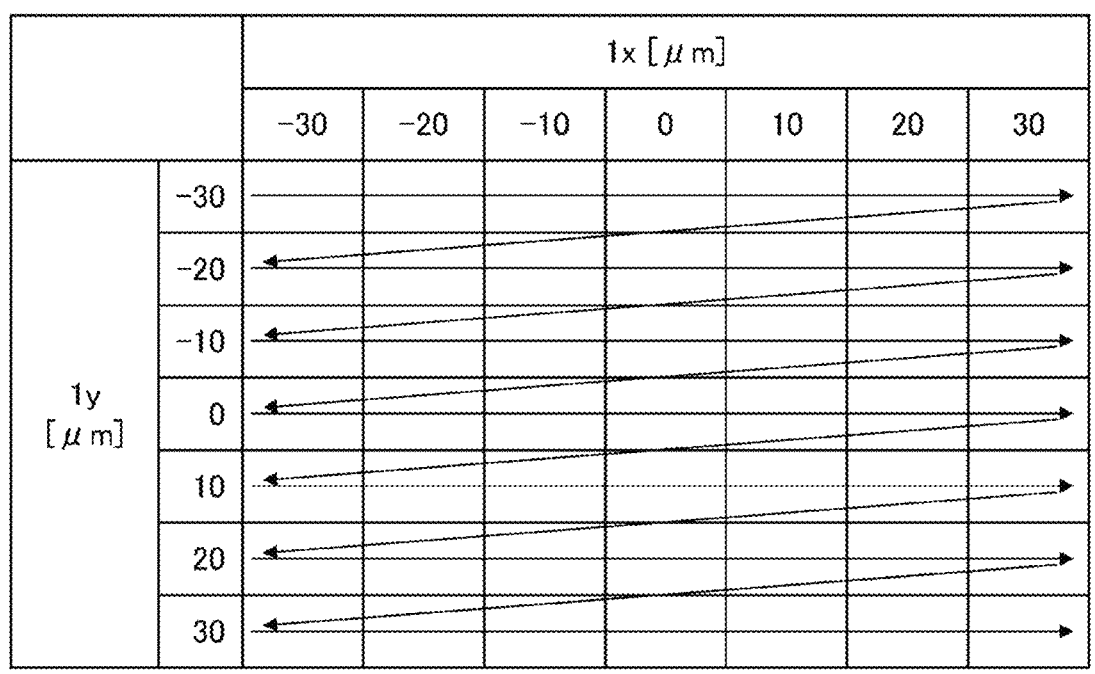
FIG. 6 is a chart showing exemplary irradiation position level groups applied to the laser irradiation position adjustment process shown in FIG. 5.
Figure 8:
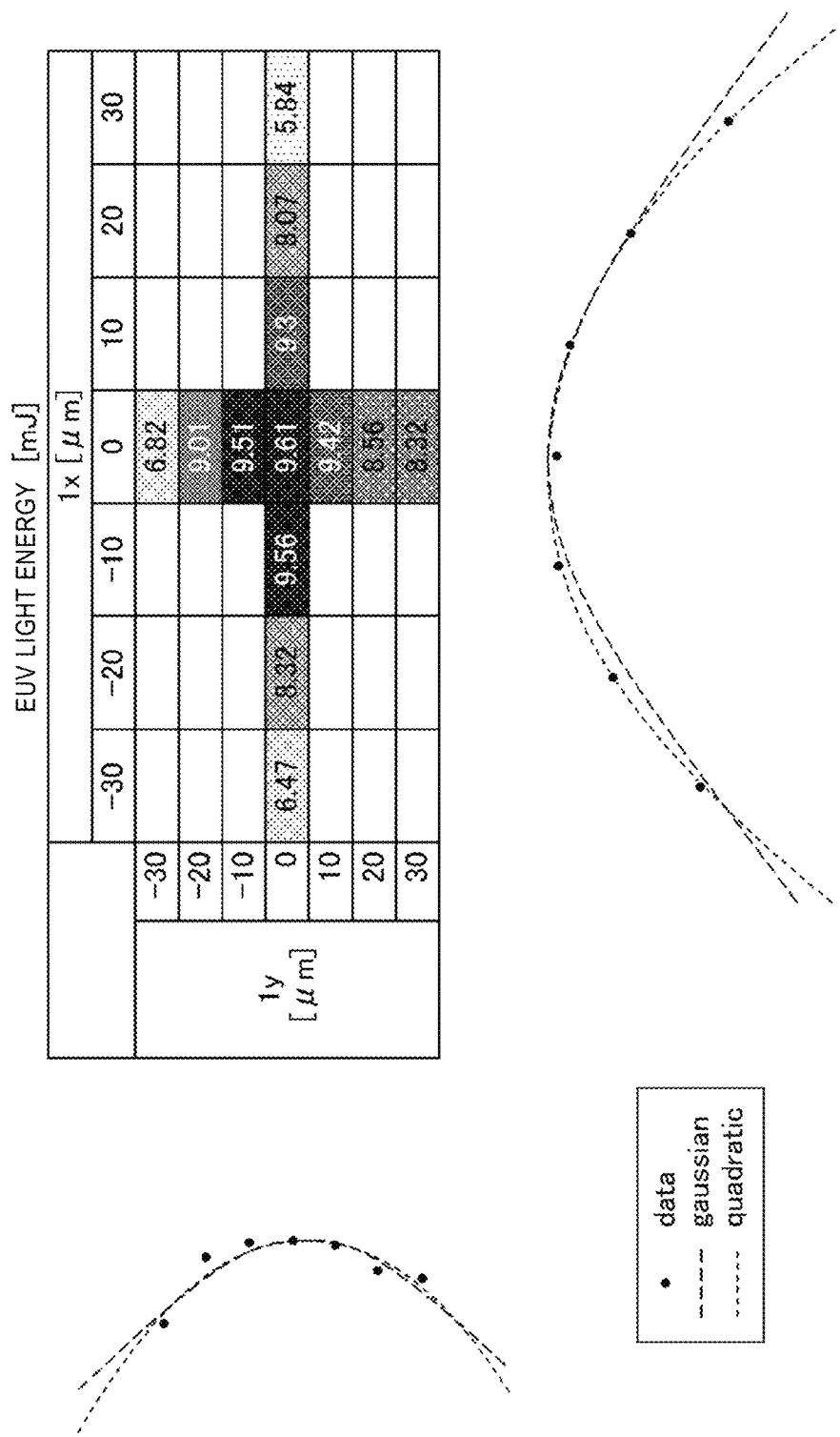
FIG. 8 is an explanatory diagram showing an exemplary approximate curve obtained from the EUV energy distribution chart shown in FIG. 7.

An example of the laser irradiation position adjustment process will be described with reference to FIGS. 5 to 8. FIG. 5 is a flowchart showing an example of the laser irradiation position adjustment process applied to each of steps S11 and S12 of FIG. 4. FIG. 6 is a chart showing exemplary irradiation position level groups applied to the laser irradiation position adjustment process shown in FIG. 5. FIG. 7 is a chart showing an exemplary EUV energy distribution chart created based on the irradiation position level groups shown in FIG. 6. FIG. 8 is an explanatory diagram showing an exemplary approximate curve obtained from the EUV energy distribution chart shown in FIG. 7.

3.4.1 Outline of Laser Irradiation Position Adjustment Process

Before explaining the flowchart shown in FIG. 5, an outline of the laser irradiation position adjustment process will be described. The EUV light generation system 11A adjusts the irradiation position of the laser light with respect to the target 27 to generate the EUV light 252 with high conversion efficiency (CE). This adjustment operation may be performed before the EUV light 252 is output to the exposure apparatus 6. The controller 5A drives the actuator 347 or the stage 72 and records the EUV energy measured by the EUV sensors 70a, 70b while scanning the laser light irradiation position in the XY plane. Hereinafter, the description "XY plane" with respect to the irradiation position adjustment means the XY plane intersecting the plasma generation region 25.

For example, as shown in FIG. 6, irradiation position levels defined in a 7×7 matrix in the XY plane having seven irradiation position levels in the X-axis direction and seven irradiation position levels in the Y-axis direction may be used. The levels may be defined with the current laser irradiation position as the origin (center), or may be defined with the optimum position in calculation as the origin. The range (region) in which the irradiation positions are scanned in each of the X-axis direction and the Y-axis direction, the step width of levels, the number of levels, and the like are not limited to the example shown in FIG. 6. The step width of levels or the number of levels may be different between the X-axis direction and the Y-axis direction. A group of levels defining the scanning range of the irradiation positions as shown in FIG. 6 is referred to as an "irradiation position level group." The irradiation position in the XY plane is represented by coordinates (1x, 1y).

When adjusting the irradiation position of the laser light, the controller 5A controls the actuator 347 or the stage 72 so that the irradiation position of the laser light is scanned on the XY plane intersecting the plasma generation region 25. Then, the controller 5A acquires the measurement result of the EUV sensors 70a, 70b for each irradiation position.

That is, the controller 5A irradiates the irradiation positions defined by the irradiation position level groups with the laser light, and records the detected EUV energy in association with each irradiation position. The EUV energy recorded for each irradiation position may be an average value of a plurality of pulses or a plurality of bursts. The controller 5A repeats the operation of acquiring the measurement value of the EUV energy by driving the actuator 347 or the stage 72 so that irradiation of the laser light is performed at a subsequent irradiation position after irradiation of the laser light is performed at a certain irradiation position. The controller 5A sequentially acquires the measurement value of the EUV energy for each position (each level) of the matrix of the irradiation position level group, and maps the measurement results. "Mapping" here includes creating a distribution chart of the EUV energy. The EUV energy distribution chart is a map image of the association between each irradiation position and the EUV energy.

An irradiation position at which high EUV energy can be realized is selected from the EUV energy distribution chart obtained in this way and set as the laser irradiation position. At this time, the controller 5A may specify the irradiation position at which the highest EUV energy can be realized by curve fitting or the like.

3.4.2 Description of Flowchart

When the laser irradiation position adjustment process is started, in step S21 of FIG. 5, the controller 5A reads the levels of the irradiation position. FIG. 6 is an example of a laser irradiation position level chart. The controller 5A has a level chart of each of the MPL irradiation position and the light concentrating unit position. The numerical values shown in FIG. 6 represent the MPL irradiation position or the position of the drive destination of the stage 72 in the XY plane. The level chart of the irradiation position is set with the current position $S_0(S_{MPL}, S_{FU})$ as the center.

As shown in FIG. 6, the irradiation position level group may be created using a table in which cells are arranged in a matrix form with Sm(0,0) before adjustment as the center. FIG. 6 shows an example in which the irradiation position levels are defined in seven stages from "−30 µm" to "+30 µm" with a step width of "10 µm" in each direction of the X-axis direction and the Y-axis direction with Sm(0,0) as the center, and the irradiation position shifts in a range of 49 irradiation position levels arranged in a 7×7 matrix.

The arrows in FIG. 6 are examples of the order of level implementation, and indicate the order of movement of the position to be irradiated with the laser light, that is, the order of level implementation. For example, the controller shifts the irradiation position in the Y-axis direction after shifting the irradiation position in the X-axis direction in accordance with the irradiation position levels in the two-dimensional array as shown in FIG. 6.

The controller 5A may hold a plurality of irradiation position level charts in advance, and read the irradiation position level chart to be applied according to an output condition of the laser light and the spot diameter D.

In step S22, the controller 5A drives the actuator 347 or the stage 72 based on the read irradiation position levels. For example, the controller 5A drives the actuator 347 or the stage 72 so that the irradiation position Sm(1x, 1y) is changed in the order indicated by the arrows in FIG. 6, to sequentially realize the values of the respective levels as the irradiation position.

In step S23, the controller 5A generates the EUV light 252 by transmitting a trigger signal to the prepulse laser device 3P and the main pulse laser device 3M in synchronization with the passage timing signal.

In step S24, the controller 5A acquires the measurement result of the EUV sensors 70a, 70b. The controller 5A acquires the values of the EUV energy measured by the EUV sensors 70a, 70b for each irradiation position Sm(1x, 1y). The EUV energy may be the sum value or the average value of the output values of the plurality of EUV sensors 70a, 70b. The controller 5A may statistically process a plurality of measurement values transmitted from the plurality of EUV sensors 70a, 70b to acquire the energy of the EUV light 252 and the variation thereof as necessary.

The controller 5A records the EUV energy acquired as the measurement result of the EUV sensors 70a, 70b in association with the respective irradiation positions Sm(1x, 1y).

Here, to acquire the measurement result of the EUV sensors 70a, 70b at one irradiation position level, the controller 5A may generate the EUV light 252 of 100 pulses or more and 100,000 pulses or less. The operation condition of the EUV light generation system 11 for generating 100,000 pulses of the EUV light 252 may be such that the duty is 50%, the number of pulses of the EUV light 252 per burst is 10,000, and the EUV light generation system 11 is operated for 10 bursts.

In step S25, the controller 5A determines whether or not acquisition of the EUV energy measurement values has been completed at all the irradiation position levels included in the read irradiation position level chart.

When the determination result of step S25 is NO, that is, when the acquisition of the EUV energy measurement values has not been completed at all the irradiation position levels, the controller 5A returns to step S22 and continues the operation of setting the remaining levels as the irradiation positions.

By repeating steps S22 to S25, the EUV energy measurement values (the measurement result of the EUV sensors 70a, 70b) for each irradiation position level is accumulated. The controller 5A creates the energy distribution chart of the EUV light 252 based on the measurement result of the EUV sensors 70a, 70b recorded in association with each irradiation position level.

On the other hand, when the determination result of step S25 is YES, that is, when the acquisition of the EUV energy measurement values at all the irradiation position levels is completed, the controller 5A proceeds to step S26.

In the case of proceeding to step S26, the energy distribution chart of the EUV light 252 as exemplified in FIG. 7 is obtained based on the measurement result of the EUV sensors 70a, 70b recorded in association with each irradiation position level. The controller 5A may cause the creation of the distribution chart to sequentially proceed in the course of repeating steps S22 to S25, or may create the distribution chart at a stage when the determination result of step S25 becomes YES.

FIG. 7 is an exemplary EUV energy distribution chart in which the value of the EUV average energy is input to a cell at each irradiation position Sm(1x, 1y). The numerical value shown in the cell at each irradiation position in FIG. 7 represents the average energy calculated from the measurement result of the plurality of the EUV sensors 70a, Here, the unit of the EUV average energy is [mJ].

In step S26 of FIG. 5, the controller 5A calculates an optimum position Smopt of the irradiation position Sm(1x, 1y) of the laser light based on the obtained EUV energy distribution chart, and stores the optimum position Smopt. For example, the controller 5A may determine the optimum position Smopt by numerical analysis using data of the created EUV energy distribution chart.

The optimum position Smopt may be obtained by using, for example, curve fitting (such as Gaussian approximation, quadratic approximation, or the like) by a least-square method or a centroid position of the distribution. As shown in FIG. 8, the controller 5A may convert each of the rows of levels in the X direction and the Y direction including the level at which the EUV energy is highest into a function by curve-fitting using a least-square method, calculate a local maximum value, and set the local maximum value as the optimum position Smopt. The optimum position Smopt is set as the target irradiation position and is stored in a memory in the controller 5A.

Instead of the calculation method of the optimum position Smopt as shown in FIG. 8, the controller 5A may determine, as the optimum position Smopt, the irradiation position Sm(1x, 1y) of the irradiation position level at which the energy of the EUV light 252 is maximum in the created EUV energy distribution chart.

In step S27, the controller 5A adjusts the actuator 347 or the stage 72 so that the laser light is radiated to the optimum position Smopt.

In step S28, the controller 5A determines whether or not the adjustment amount from the current position of the actuator 347 or the stage 72 is equal to or less than the allowable value R.

When the determination result of step S28 is YES, that is, when the adjustment amount is less than the allowable value R, it is considered that appropriate adjustment has been performed, and the controller 5A ends the flowchart of FIG. 5 and returns to the flowchart of FIG. 4. In the case of the MPL irradiation position adjustment, when the absolute value of the difference between the optimum position $Sa_{MPL}$ and the irradiation position $S_{MPL}$ before the adjustment is within the allowable value R, the irradiation position adjustment is finished. In the case of the light concentrating unit irradiation position adjustment, when the absolute value of the difference between the optimum position $Sa_{FU}$ and the position $S_{FU}$ before the adjustment is within the allowable value R, the irradiation position adjustment is finished.

On the other hand, when the determination result of step S28 is NO, that is, when the adjustment amount exceeds the allowable value R, the controller 5A proceeds to step S29 so that the adjustment irradiation is performed again.

In step S29, the controller 5A sets the optimum position Smopt as the current position and updates the irradiation position levels with the optimum position Smopt as the center. That is, the controller 5A develops the levels with the optimum position Smopt as the center, and creates a new laser irradiation position level chart. As a result, a control margin of the actuator 347 or the stage 72 is secured around the optimum position Smopt.

After step S29, the controller 5A returns to step S21 and repeats steps S21 to S28.

The flowchart of FIG. 5 is performed in the order of the MPL irradiation position adjustment (step S11) and the light concentrating unit position adjustment (step S12) according to the flowchart of FIG. 4, and the optimum irradiation position $Sa_{MPL}$ of the MPL and the optimum position $Sa_{FU}$ of the light concentrating unit are determined from the EUV energy distribution charts of the respective levels.

3.5 Effect

According to the laser irradiation position adjustment of the EUV light generation system 11A according to the comparative example, since the laser irradiation position is obtained by the same algorithm and numerical analysis using the output of the EUV sensors 70a, 70b as an index, it is possible to derive the light emission condition of high CE with good reproducibility.

3.6 Problem

When the PPL irradiation position is optimized using the EUV energy as an index, there is a possibility that the PPL irradiation position with respect to the droplet DL is deviated from the center part and a diffusion target asymmetrical with respect to the laser irradiation axis is formed. The EUV energy to be the index of the optimization may be calculated as the sum value or the average value of the energy measured by the plurality of EUV sensors 70a, 70b. This is because the sum output or the average output of the EUV sensors 70a, 70b arranged to surround the Z axis is used for control in order to grasp the total amount of the generated EUV light 252. Similarly, when the EUV energy is measured by one EUV sensor, for example, a measurement system may be configured to reflect the output of the concentrated light at the intermediate focal point 292.

FIG. 9 schematically shows a case in which the center of the droplet DL is irradiated with the prepulse laser light 31P. The diffusion target DT generated by irradiating the droplet DL with the prepulse laser light 31P often diffuses in a disk shape, and the main pulse laser light 31M is radiated to a planar part of the diffusion target DT. In FIG. 9, "PPL" represents the prepulse laser light 31P, and "MPL" represents the main pulse laser light 31M. The same applies to FIGS. 10 and 11. FIG. 10 schematically shows a case in which a position of the droplet DL shifted from the center in the −Y direction is irradiated with the prepulse laser light 31P. FIG. 11 schematically shows a case in which a position of the droplet DL shifted from the center in the +Y direction is irradiated with the prepulse laser light 31P.

As shown in FIG. 9, when the PPL irradiation position is the target center, the minor axis of the diffusion target DT and the laser irradiation axis (Z axis) coincide with each other, and the position of the diffusion target DT will be the maximum in the Z-direction distance with no Y-direction deviation. In addition, the diameter of the diffusion target DT is the largest in the major axis. The Y-direction deviation represents a deviation of the diffusion target DT position in the Y direction from the Z axis. At this time, the diffusion target DT is distributed to be dense from the inner side to the outer side. The EUV light 252 is emitted when diffusion target DT is irradiated with the main pulse laser light MPL. An EUV radiation angle distribution is schematically shown in the lowermost part of FIG. 9. In FIG. 9, the EUV light 252 is emitted symmetrically with respect to the Z axis. Therefore, the sensor output (EUV energy measurement values) of the two EUV sensors A, B arranged to surround the Z axis are substantially the same. The EUV sensors A, B may be the EUV sensors 70a, 70b in FIG. 3.

On the other hand, when the PPL irradiation position is at the −Y side of the droplet DL as shown in FIG. 10, the major axis of the diffusion target DT is inclined with respect to the laser irradiation axis, and the surface of the diffusion target DT irradiated with the main pulse laser light 31M faces the −Y side. The position of the diffusion target DT decreases in the Z-direction distance and increases in the Y-direction deviation as compared to the normal case (FIG. 9). At this time, the major diameter of the diffusion target DT decreases, and the density distribution is deviated in the +Y direction.

When the asymmetric diffusion target DT shown in the middle of FIG. 10 is irradiated with the main pulse laser light MPL, since the optimum target density distribution for EUV emission is formed on the −Y side, the EUV light 252 is emitted more in this direction (on the −Y side). Therefore, when a plurality of the EUV sensors A, B are arranged as shown in FIG. 10, the measurement value of the EUV sensor B becomes large compared to the measurement value of the EUV sensor A.

On the other hand, when the PPL irradiation position is at the +Y side of the droplet DL as shown in FIG. 11, the surface of the diffusion target DT irradiated with the main pulse laser light 31M faces the +Y side. The position of the diffusion target DT decreases in the Z-direction distance and increases in the Y-direction deviation as compared to the normal case (FIG. 9). At this time, the major diameter of the diffusion target DT decreases, and the density distribution is deviated in the −Y direction.

When the asymmetric diffusion target DT shown in FIG. 11 is irradiated with the main pulse laser light MPL, since the optimum target density distribution for EUV emission is formed on the +Y side, the EUV light 252 is emitted more in this direction (on the +Y side). Therefore, when a plurality of the EUV sensors A, B are arranged as shown in FIG. 11, the measurement value of the EUV sensor A becomes larger than the measurement value of the EUV sensor B.

However, even in the cases of FIGS. 10 and 11, since the difference between the measurement values of the sensors is canceled out in the sum value or the average value of the sensor output values of the plurality of EUV sensors A, B, it cannot be distinguished from the normal irradiation state shown in FIG. 9.

Further, as shown in FIGS. 10 and 11, when the asymmetric diffusion target DT is irradiated with the main pulse laser light 31M, residual fragments Rfg are generated from the high density region and adheres to the EUV light concentrating mirror 23 to reduce the reflectance of the EUV light concentrating mirror 23. Further, high energy ions of the target substance are generated to accelerate wear of the reflection film of the EUV light concentrating mirror 23.

That is, as in the comparative example, when the PPL irradiation position is optimized using the EUV energy as an index, there is a possibility that the PPL irradiation position with respect to the droplet DL is deviated from the center part and an asymmetric diffusion target DT is formed. When the asymmetric diffusion target DT is irradiated with the main pulse laser light 31M, there is a problem that the EUV light concentrating mirror 23 is deteriorated due to the residual fragments Rfg and high energy ions. Not only when a plurality of the EUV sensors A, B are arranged, but also when there is one EUV sensor, the possibility of forming an asymmetric diffusion target DT also exists.

4. First Embodiment 4.1 Configuration

Figure 12:
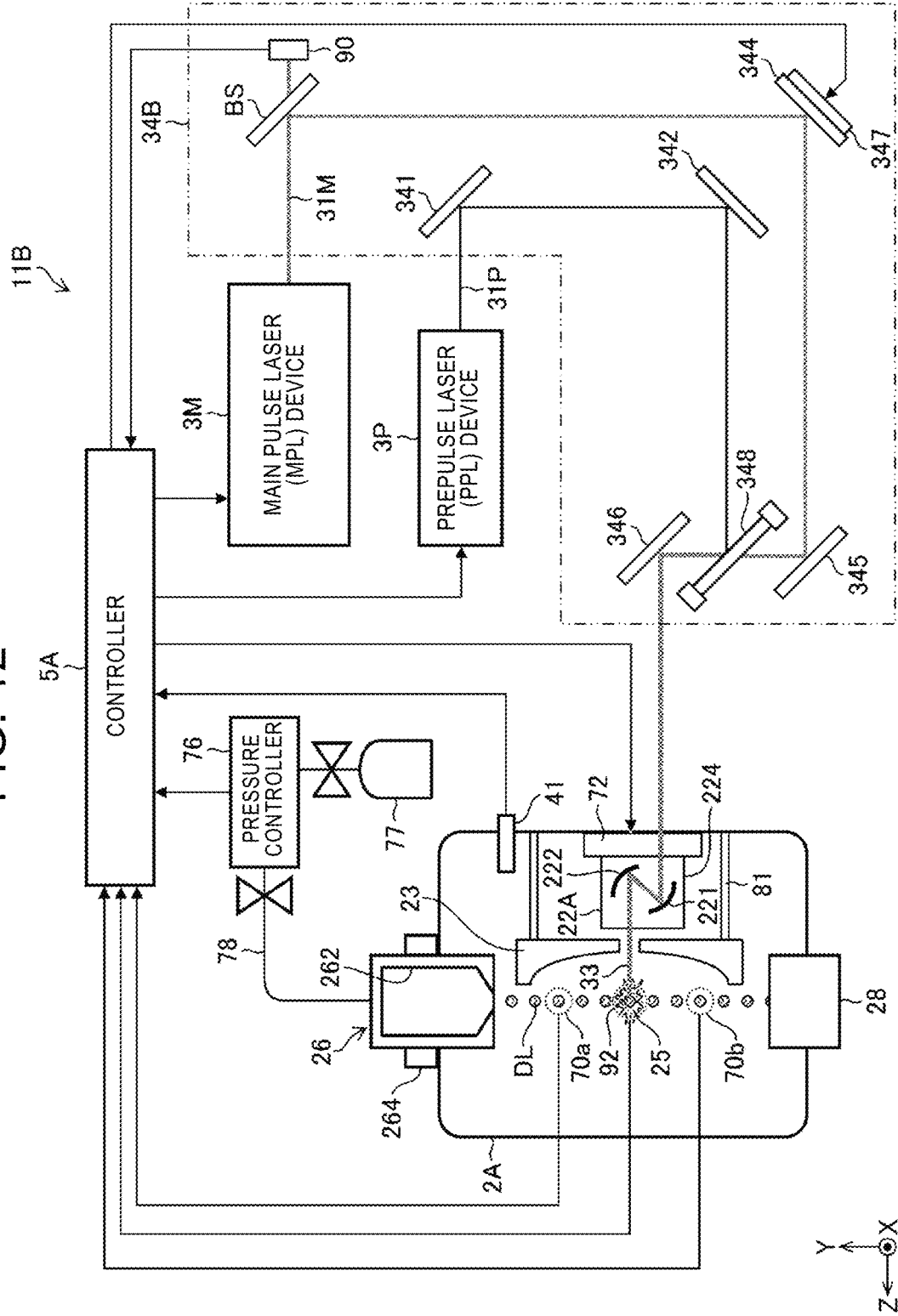
FIG. 12 schematically shows the configuration of the EUV light generation system according to a first embodiment.

FIG. 12 schematically shows the configuration of an EUV light generation system 11B according to a first embodiment. The configuration shown in FIG. 12 will be described in terms of differences from the configuration shown in FIG. 3. The EUV light generation system 11B according to the first embodiment includes an MPL energy sensor 90 and a target sensor 92 in addition to the EUV light generation system 11A of the comparative example shown in FIG. 3. Further, in the EUV light generation system 11B, a beam splitter BS is arranged in place of the high reflection mirror 343 shown in FIG. 3. The MPL energy sensor 90 is arranged at a position where the light transmitted through the beam splitter BS is received, and detects the pulse energy (main pulse energy) of the main pulse laser light 31M. The MPL energy sensor 90 is an example of the "laser energy sensor" in the present disclosure.

In the first embodiment, the ratio CE of the EUV energy with respect to the main pulse energy is used as an index for evaluating the PPL irradiation position and the MPL irradiation position with respect to the target 27. CE is defined by the following equation and indicates the energy conversion efficiency.

$$CE = \text{EUV energy/Main pulse energy at plasma generation point}$$

The reason of using CE as the index to evaluate the laser irradiation position is based on the finding that CE reflects the MPL irradiation state with respect to the diffusion target DT. When high CE is obtained, generation of the residual fragments Rfg is reduced, and contamination of the EUV light concentrating mirror 23 and the like are suppressed.

The EUV light generation system 11B according to the first embodiment includes the MPL energy sensor 90 for evaluating CE. FIG. 12 shows an example in which the beam splitter BS is arranged in place of the high reflection mirror 343 shown in FIG. 3, but the MPL energy sensor 90 may be arranged such that any high reflection mirror on the optical path of the main pulse laser light 31M from the main pulse laser device 3M to the combiner 348 is changed to the beam splitter BS to measure light transmitted therethrough.

The target sensor 92 includes, for example, a CCD as an image sensor and an image intensifier unit (IIU) shutter as a high speed shutter. The IIU shutter is an example of the "shutter" in the present disclosure. Other configurations may be similar to those of the EUV light generation system 11 shown in FIG. 3. The stage 72 of the light concentrating unit 22A is an example of the "first actuator" in the present disclosure. The actuator 347 is an example of the "second actuator" in the present disclosure.

Figure 13:
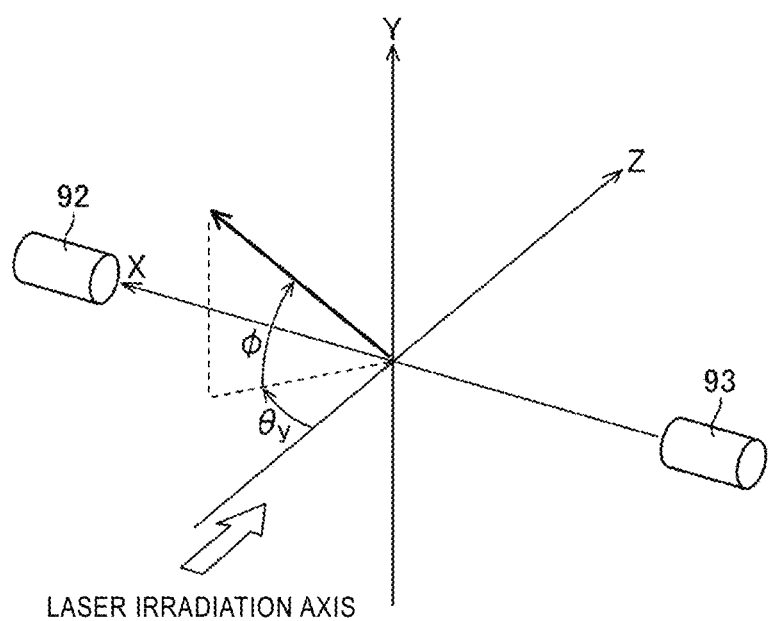
FIG. 13 is an explanatory diagram showing an arrangement example of a target sensor.

FIG. 13 is an explanatory diagram showing an arrangement example of the target sensor 92. As an index for evaluating the PPL irradiation position, a characteristic value of the diffusion target DT captured by the target sensor 92 is used. The stage 72 of the light concentrating unit 22A may be used to adjust the PPL irradiation position.

The target sensor 92 is arranged at a position that does not interfere with the EUV optical path from the plasma generation region 25 to the intermediate focal point 292 and so as to include the plasma generation region 25 in the field of view. For example, as shown in FIG. 13, the target sensor 92 may be arranged so as to image the YZ plane with θy=90 deg and φ=0 deg. The illumination light source 93 is arranged to face the target sensor 92. The target sensor 92 and the illumination light source 93 are connected to the controller 5A.

4.2 Operation

4.2.1 Observation Example of Diffusion Target

Figure 14:
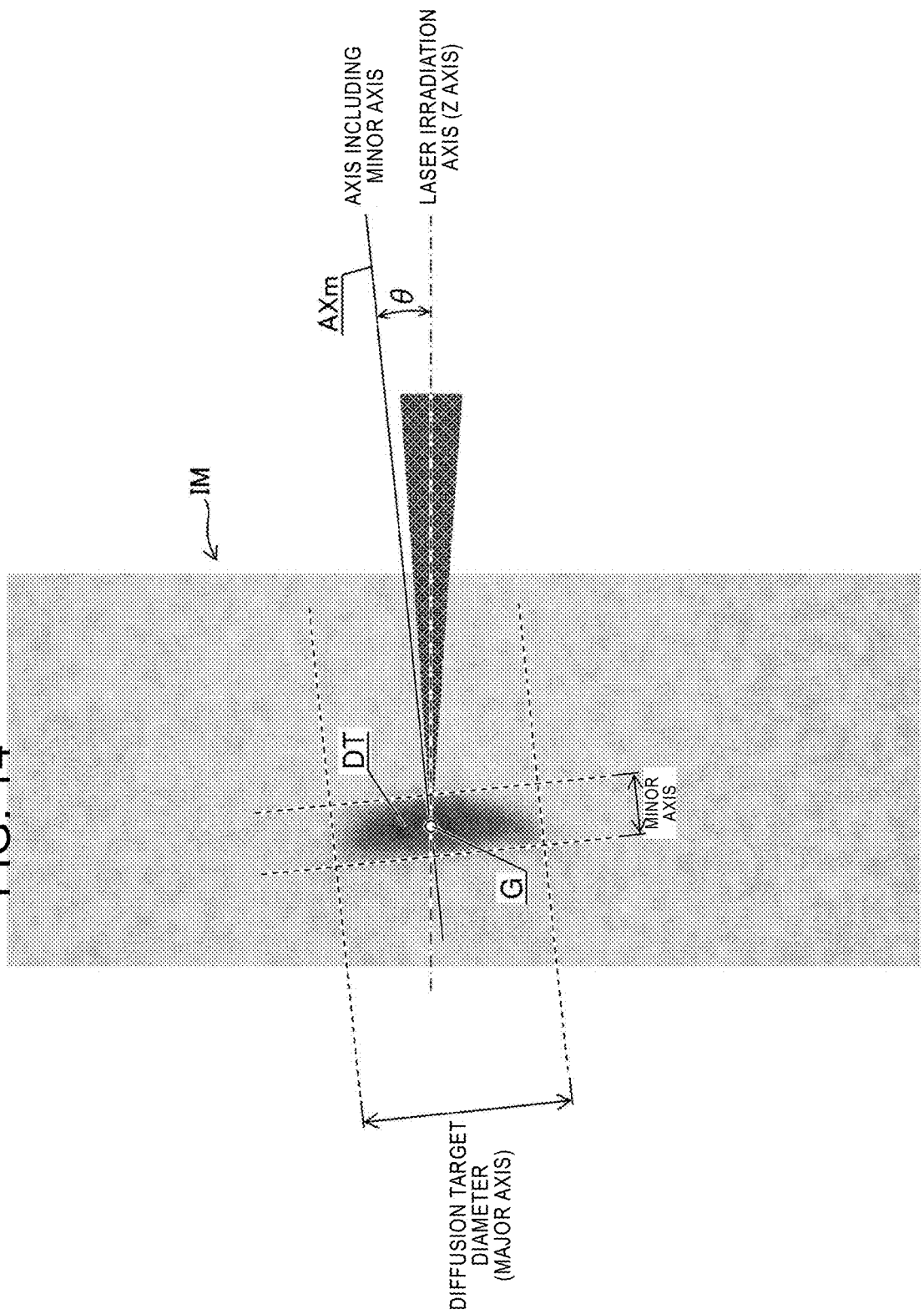
FIG. 14 shows an observation example of a diffusion target imaged by the target sensor.

FIG. 14 shows an observation example of the diffusion target DT imaged by the target sensor 92. The controller 5A causes the target sensor 92 to perform imaging at a timing after the prepulse laser light 31P is output, so that an image IM as exemplified in FIG. 14 can be obtained. At this time, the IIU shutter and the illumination light source 93 are operated in synchronization with each other. The diffusion target DT is illuminated (backlighted) from behind by the illumination light source 93, and the transmitted light is received by the target sensor 92. Therefore, in the image IM captured by the target sensor 92, a part of the diffusion target DT becomes a dark part (shadow).

The controller 5A analyzes the image IM to obtain the characteristic value of the diffusion target DT. The characteristic value may be, for example, the diameter, position, angle, or the like of the diffusion target DT. The diameter of the diffusion target DT is one of the indices indicating the size of the diffusion target DT. For example, as shown in FIG. 14, a case in which the diffusion target DT is imaged as an elliptic shadow is considered. The obtained image IM is blob-processed and then elliptically approximated. The diffusion target diameter may be a major diameter of the approximated ellipse or the like. In the case of imaging the YZ plane, the diffusion target diameter may be a projection size with respect to the Y axis and/or the Z axis. Further, the position of the diffusion target DT may be the centroid coordinate or the like of the diffusion target DT on the image IM. A point G in FIG. 14 represents the centroid calculated from the diffusion target DT on the image IM. Further, an angle θ of the diffusion target DT may be an angle formed between a laser irradiation axis (Z axis) and an axis AXm including the minor axis. The controller 5A may acquire one or more characteristic values of the size, position, and angle of the diffusion target DT.

4.2.2 Timing Chart of Backlight Observation

Figure 15:
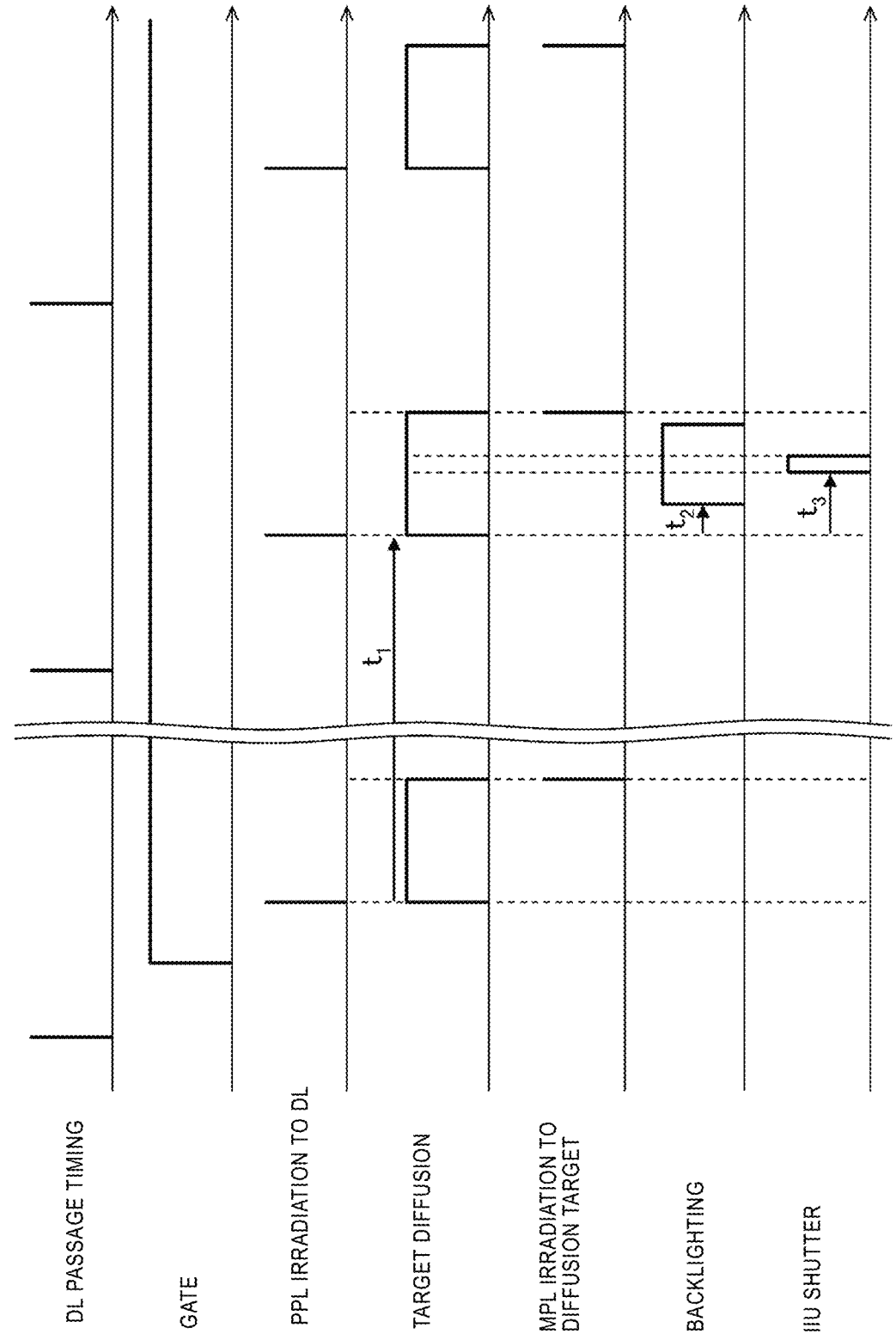
FIG. 15 is a timing chart of backlight observation using the target sensor.

FIG. 15 is a timing chart of backlight observation using the target sensor 92. The diffusion target DT continues to diffuse for several hundred ns from PPL irradiation to MPL irradiation to the droplet DL. The backlight (illumination light source 93) is turned on after a predetermined delay time $(t_1+t_2)$ elapses starting from PPL irradiation timing immediately after the gate opening (ON). Here, $t_1$ designates imaging, at an arbitrary timing in the gate, of the diffusion target DT irradiated with the prepulse laser light 31P, and is n times of a PPL irradiation time interval to the droplet DL. Further, $t_2$ is a delay time from the PPL irradiation timing.

Similarly, the IIU shutter of the target sensor 92 is opened after a predetermined delay time $(t_1+t_3)$ elapses from the same starting point. Here, $t_3$ is a delay time from the PPL irradiation timing. The shutter operation is performed at a timing and an exposure time within the target diffusion time. That is, the IIU shutter is opened and closed during the diffusion time of the diffusion target DT. Here, $t_1$, $t_2$, and $t_3$ are constants. Therefore, for each burst, an image is acquired at a specific timing based on the start of the burst.

Since the backlight is turned on and the repetition frequency of the IIU shutter is about 100 Hz, the number of times of imaging is about 1 per burst during the burst operation. In a burst in which the burst period is relatively long or continuous operation, a plurality of imaging results may be statistically processed. When the exposure time is elongated and a plurality of diffusion targets DT are subjected to multiple exposure in one imaging, or an average image (integrated image) of a plurality of captured images is generated, the characteristic value becomes blurry due to variation in the diffusion targets DT. Therefore, it is preferable not to perform multiple exposure or an integration process (overwriting) of images.

According to such a configuration, it is possible to image the generation of the diffusion target DT that is generated in a short time even with CCD operation in which the imaging device has slow response. Although the backlight observation has been described as an example in FIGS. 13 to 15, a similar timing chart is applied to a case of reflection light observation.

4.2.3 Laser Irradiation Position Adjustment

Figure 16:
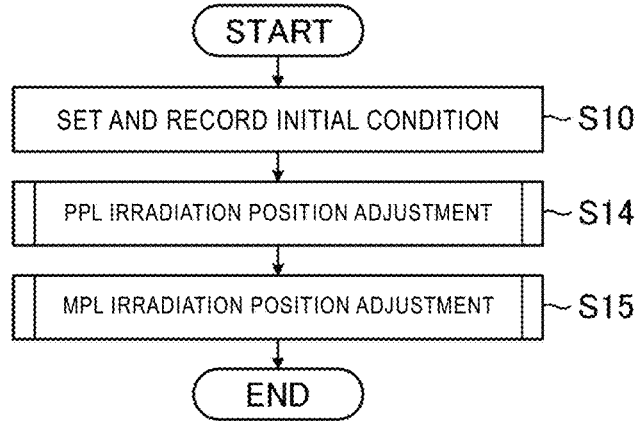
FIG. 16 is a flowchart of the laser irradiation position adjustment performed in the EUV light generation system according to the first embodiment.

FIG. 16 is a flowchart of the laser irradiation position adjustment performed in the EUV light generation system 11B according to the first embodiment. The flowchart shown in FIG. 16 will be described in terms of differences from that shown in FIG. 4. In the flowchart of FIG. 16, steps S14 and S15 are included in place of steps S11 and S12 of FIG. 4.

That is, after step S10, the controller 5A performs the process of PPL irradiation position adjustment in step S14, and thereafter, performs MPL irradiation position adjustment in step S15.

The PPL irradiation position adjustment in step S14 is a light concentrating unit position adjustment for adjusting the stage 72 of the light concentrating unit 22A using, as the index, the characteristic value of the diffusion target DT obtained by the imaging process of the diffusion target DT imaged using the target sensor 92. At this time, since it is not necessary to irradiate the diffusion target DT with the main pulse laser light 31M, the light concentrating unit position adjustment is substantially to adjust the irradiation position of the PPL. However, when the irradiation position adjustment including thermal load (irradiation position adjustment at a so called hot state) is performed, the MPL may be radiated.

In the MPL irradiation position adjustment of step S15, the MPL irradiation position is adjusted by adjusting the actuator 347 of the high reflection mirror 344 on the MPL optical path using CE as the index.

The respective position adjustment algorithms of the PPL irradiation position adjustment (step S14) and the MPL irradiation position adjustment (step S15) may be common, and the index and the search width Δ for the respective adjustment processes use different parameters in step S14 and step S15.

The index of the PPL irradiation position adjustment (step S14) may be, for example, the diffusion target diameter, and the index of the MPL irradiation position adjustment (step S15) may be CE. Here, the diffusion target diameter may be obtained as follows, for example.

The controller 5A obtains the diffusion target diameters from the respective images imaged by the target sensor 92 in a plurality of bursts, and calculates the average value of the diffusion target diameters. In the calculation of the diffusion target diameter, for example, as described with reference to FIG. 14, the major diameter when the blob-processed result is elliptically approximated may be calculated, or a size projected onto the reference coordinate system may be calculated.

In addition, the burst ON time is about several ms to 1 second and the number of bursts is about 3 to 10, and the imaging samples are acquired in each bursts. In this case, the number of images to be acquired is about 3 to 10.

In the determination of the search direction, the irradiation position is changed by the search width Δ in each of the +direction and the −direction with respect to the current position, and the performance improvement direction is determined from the data of three points including the current position. The slope of the linear approximation of these three data points may be used for the determination.

After step S15, the controller 5A ends the flowchart of FIG. 16.

Figure 17:
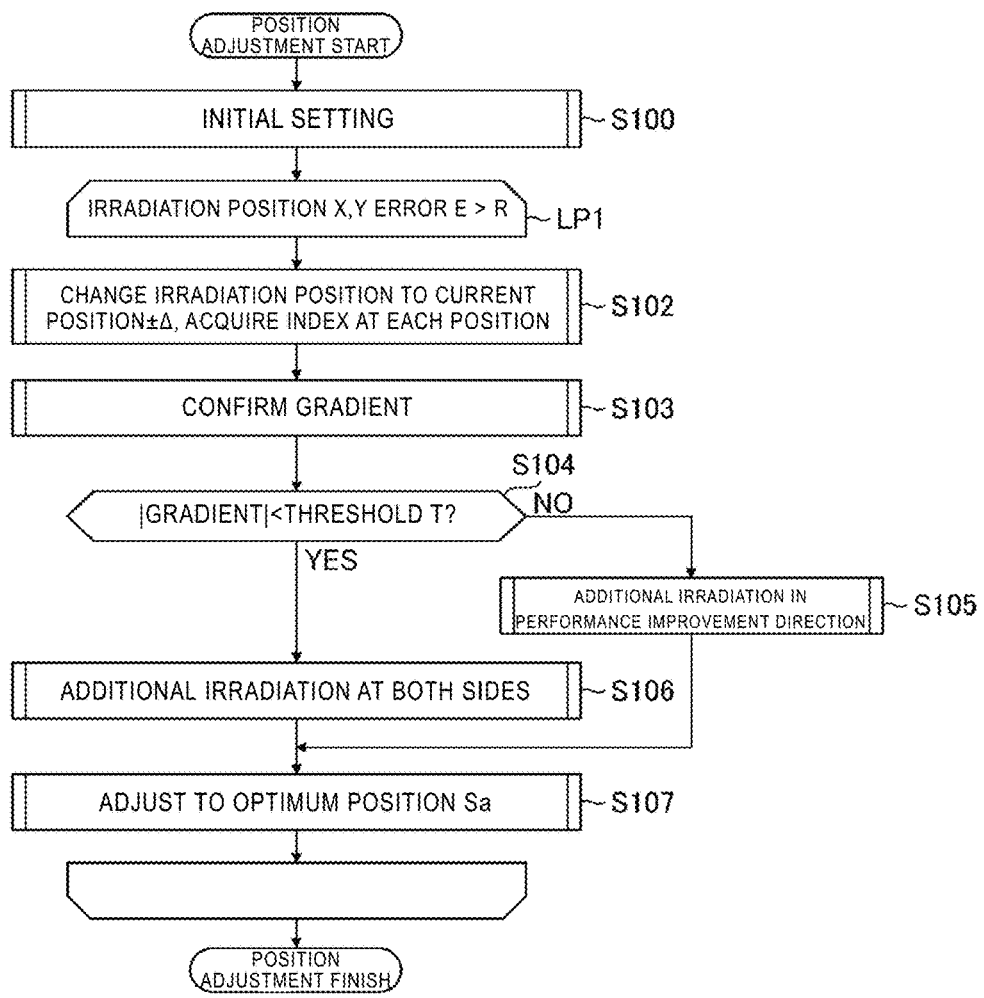
FIG. 17 is a flowchart showing an example of the laser irradiation position adjustment process applied to steps S14 and S15 of FIG. 16.

FIG. 17 is a flowchart showing an example of the laser irradiation position adjustment process applied to steps S14 and S15 of FIG. 16.

In step S100, the controller 5A performs initial setting of various parameters required for the process. The controller 5A sets the threshold T of the gradient, the search width Δ, the allowable value R of an irradiation position error E which is the adjustment amount, a number of additional irradiation level n, and a search count N, and reads the initial irradiation position S corresponding to the current position. The allowable value R may be a determination value for determining whether or not to end the adjustment.

After step S100, the controller 5A proceeds to a loop process LP1. The loop process LP1 includes steps S102 to S107. The controller 5A continues the loop process LP1 while the irradiation position error E is larger than the allowable value R. When the irradiation position error E becomes equal to or less than the allowable value R (E≤R), the controller 5A determines that adjustment converges, and exits the loop process LP1. The loop upper limit count of the loop process LP1 is the search count N.

In step S102, the controller 5A changes the irradiation position to the position of the current position±Δ, and acquires the indices at the respective positions. For example, the controller 5A performs laser irradiation and acquires the index at respective positions in the order of [1] current position, [2] "current position−Δ", and [3] "current position+Δ." As described above, the index differs depending on the target to be adjusted.

In step S103, the controller 5A confirms the gradient of the index. The gradient may be, for example, a slope (gradient) of a straight line according to a linear approximation of the value of the index acquired at each of the three points of the current position±Δ (see FIG. 18). The gradient indicates the proportion of the change in the value of the index to the change in the irradiation position. Here, the gradient can be obtained from the value of the index acquired at each position of two or more points.

In step S104, the controller 5A determines whether or not the absolute value of the gradient is less than the threshold T. When the determination result in step S104 is NO, that is, when |gradient|≥threshold T is satisfied, the controller 5A proceeds to step S105.

In step S105, the controller 5A performs additional irradiation in a performance improvement direction. The adjustment amount (search width) in the search (additional search) of the additional irradiation may be Δ. The performance improvement direction means a direction in which the value of the index increases. For example, when the gradient (the slope of the linear approximation) calculated from the three-point index values is a positive value, the additional search is performed further in the positive direction than [3] "current position+Δ." For example, when the number of additional irradiation levels n is "n=2", the controller 5A performs, in the direction in which the value of the index becomes larger, additional laser irradiation and acquires the index at the respective positions in the order of [4] "current position+2Δ", and [5] "current position+3Δ."

On the other hand, when the determination result in step S104 is YES, that is, when |gradient|<threshold T is satisfied, the controller 5A proceeds to step S106.

In step S106, the controller 5A performs additional irradiation at both of the further positive side of the "current position+Δ" and at the further negative side of the "current position−Δ." For example, when the number of additional irradiation levels n is "n=2", the controller 5A performs additional laser irradiation and acquires the index at the respective positions of [4] "current position+2Δ" at the positive side and [5] "current position−2Δ" at the negative side of the three points.

After step S105 or S106, the controller 5A proceeds to step S107.

In step S107, the controller 5A adjusts an optimum position Sa based on the values of the index at the respective positions of the "3+n" points including the additional irradiation. The controller 5A approximates plots of the index obtained at the respective positions with a quadratic approximation curve or a Gaussian curve, calculates the optimum position Sa at which the index is maximized, and adjusts the stage 72 or the actuator 347 to the optimum position Sa.

The controller 5A determines the termination condition of the loop process LP1, and repeats steps S102 to S107 until the termination condition is satisfied. At this time, the difference between the initial irradiation position S corresponding to the current position before the last adjustment and the optimum position Sa after the last adjustment is set as the irradiation position error E and compared with the allowable value R. When the termination condition of the loop process LP1 is satisfied, the controller 5A exits the loop process LP1, ends the flowchart of FIG. 17, and returns to the flowchart of FIG. 16.

Figure 18:
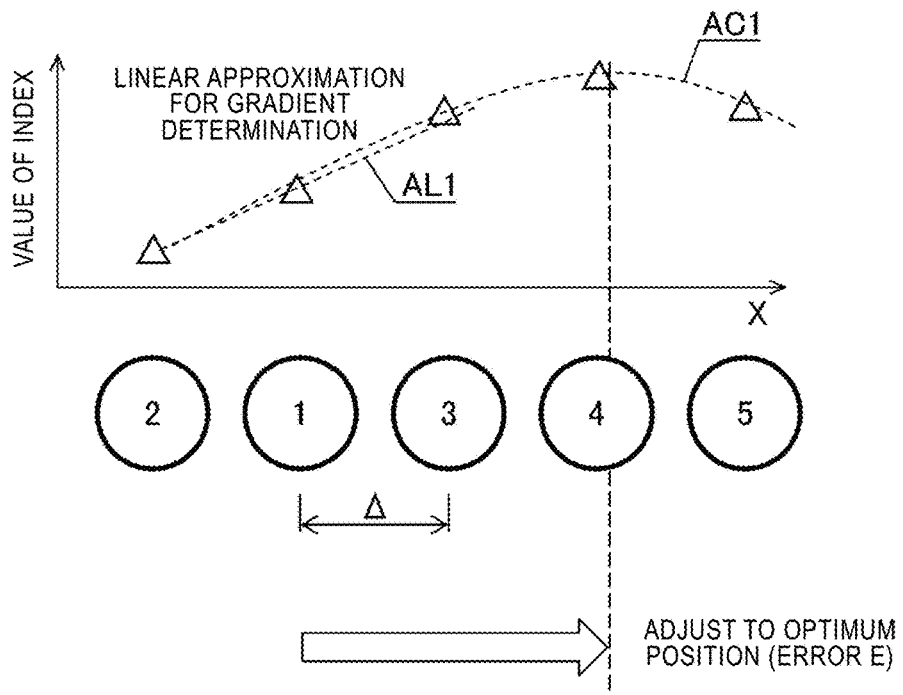
FIG. 18 is an explanatory diagram related to the process of step S103 to step S107 of FIG. 17, and shows an example in which the absolute value of a gradient is larger than a threshold.
Figure 19:
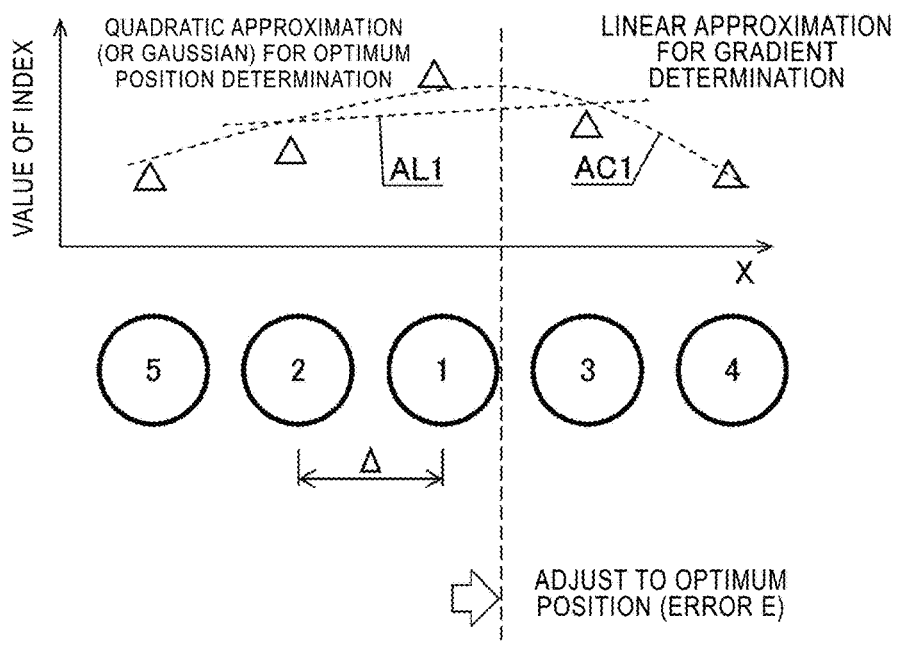
FIG. 19 is an explanatory diagram related to the process of step S103 to step S107 of FIG. 17, and shows an example in which the absolute value of the gradient is equal to or less than the threshold.

FIGS. 18 and 19 are explanatory diagrams related to the process of step S103 (gradient confirmation) to step S107 (adjustment to the optimum position Sa) in FIG. 17. FIG. 18 shows an example in which the absolute value of the gradient is larger than the threshold T. FIG. 19 shows an example in which the absolute value of the gradient is equal to or less than the threshold T. In FIGS. 18 and 19, the horizontal axis represents the irradiation position, and the vertical axis represents the value of the index. Circles in the figures represent the irradiation positions, and numbers in the circles represent the irradiation order. For example, irradiation order 1 corresponds to the "current position", irradiation order 2 corresponds to the "current position−Δ", and irradiation order 3 corresponds to the "current position+Δ." From these three points, the slope (gradient) of an approximate straight line AL1 indicated by a broken line can be obtained by linear approximation. The gradient of the value of the index is preferably defined on the basis of data of at least three points.

In the example of FIG. 18, the slope of the approximate straight line AL1 is positive, and the direction in which the value of the irradiation position increases with respect to the "current position" of the irradiation position is the direction of improving the value of the index. Therefore, in this case, as the process of step S105, an additional search is performed in the positive direction (improvement direction) from the "current position+Δ" of irradiation order 3. The controller 5A acquires indices at the respective positions by additional irradiation corresponding to the number of additional irradiation levels n, such as irradiation order 4 "current position+2Δ" and irradiation order 5 "current position+3Δ" shown in FIG. 18.

Then, the controller 5A approximates the respective plots of the five points with a quadratic approximation curve AC1 or the Gaussian curve, and calculates the optimum position Sa. The controller 5A may calculate, as the optimum position Sa, the irradiation position at which the approximation curve takes an extreme value (in this case, a maximum value). The controller 5A adjusts the stage 72 or the actuator 347 to the optimum position Sa.

In FIG. 19, the absolute value of the slope of the approximate straight line AL1 is equal to or less than the threshold T. Therefore, in this case, as the process of step S106, the controller 5A acquires the indices at the respective positions by additional irradiation corresponding to the number of additional irradiation levels n, such as irradiation order 4 "current position+2Δ" and irradiation order 5 "current position−2Δ" shown in FIG. 19.

Then, the controller 5A approximates the respective plots of the five points with the quadratic approximation curve AC1 or the Gaussian curve, and calculates the optimum position Sa. The controller 5A adjusts the stage 72 or the actuator 347 to the optimum position Sa.

The irradiation positions of the irradiation order 4 and the irradiation order 5 shown in FIGS. 18 and 19 are examples of the "additional irradiation position" in the present disclosure. In the examples shown in FIGS. 17 to 19, the case in which the irradiation position at which the value of the index is maximized is searched has been described, but there may be cases in which the irradiation position at which the value of the index is minimized is searched depending on the type of the index. For example, when an angle formed by the minor axis and the laser irradiation axis is used as the characteristic value of the diffusion target DT, the irradiation position is searched so that the magnitude of the angle approaches 0 (becomes a minimum value).

4.3 Effect

According to the first embodiment, CE can be maximized with good reproducibility in the initial adjustment. In particular, the possibility of adjusting the diffusion target to an asymmetric state can be reduced, EUV energy stability can be increased, and the generation of fragments can be suppressed.

5. Second Embodiment

5.1 Configuration

Figure 20:
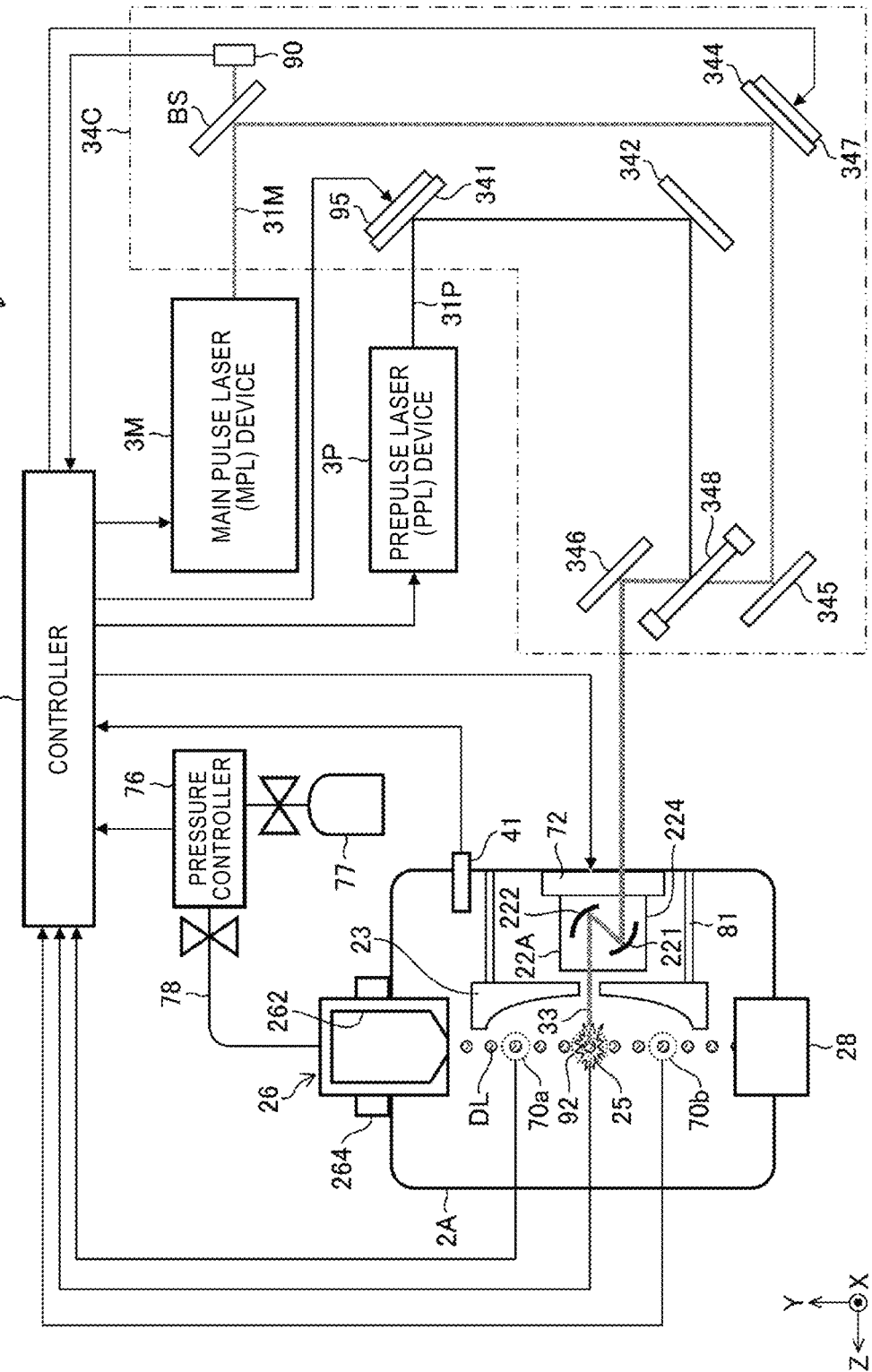
FIG. 20 schematically shows the configuration of the EUV light generation system according to a second embodiment.

FIG. 20 schematically shows the configuration of an EUV light generation system 11C according to a second embodiment. The configuration shown in FIG. 20 will be described in terms of differences from the configuration shown in FIG. 12. The EUV light generation system 11C according to the second embodiment includes an actuator 95 capable of adjusting the angle of the high reflection mirror 341 which forms the optical path of the prepulse laser light 31P as means for changing the PPL irradiation position with respect to the EUV light generation system 11B shown in FIG. 12. Not limited to the high reflection mirror 341, the actuator 95 may be arranged so as to be able to adjust the angle of any of the high reflection mirrors on the prepulse laser optical path from the prepulse laser device 3P to the combiner 348. The actuator 95 is connected to the controller 5A. Other configurations may be similar to the configurations described with reference to FIG. 12.

It is similar to the first embodiment in that the characteristic value of the diffusion target DT (see FIG. 14) imaged by the target sensor 92 is used as the index for evaluating the PPL irradiation position.

5.2 Operation

The operation of the EUV light generation system 11C shown in FIG. 20 is different from the operation of the EUV light generation system 11B of the first embodiment in that the irradiation position of the prepulse laser light 31P is adjusted by driving the actuator 95 at the time of the PPL irradiation position adjustment (step SP14) described with reference to FIG. 16. Other operation and processing algorithms are similar to those of the first embodiment.

5.3 Effect

According to the EUV light generation system 11C of the second embodiment, since the prepulse laser light 31P is operated independently from the main pulse laser light 31M, the disturbance in optimizing the MPL irradiation position is reduced and the settling time is shortened compared to the configuration in which the light concentrating unit 22A is driven as in the first embodiment.

6. Third Embodiment

6.1 Phenomenon that Droplet Position Varies

In some cases, the position of the droplet DL to be irradiated next may vary due to the plasma generation with the laser irradiation to the target 27. Such a variation in the droplet position is called "droplet position shift." Typically, the time at which the droplet position shift occurs is about 1 to 20 ms after the beginning of the burst. It has been found that the droplet position is stabilized at a predetermined position after about 20 ms elapses from the beginning of the burst, and the variation range is reduced.

On the other hand, the optical element configuring the laser optical path is also slightly heated by transmitting or reflecting the laser light, and the spot diameter of each laser light may vary by the thermal lens effect. It has been found that the variation of the spot diameter is stabilized at a predetermined diameter after about 1 second elapses from the beginning of the burst, and the variation range is reduced.

The EUV light generation system 11B, 11C operates in burst operation for wafer exposure application and CW operation (continuous operation at a predetermined repetition frequency) for mask inspection application. The burst ON time (burst duration) of the burst pattern for the wafer exposure application is of the order of 100 ms to 500 ms and exceeds the time at which the droplet position shift is stabilized. Further, it is not used for exposure for several 10 ms from the beginning of the burst. Further, in the mask inspection application, the EUV light can be used for inspection after the droplet position shift is stabilized. Therefore, in either application, it is desired to adjust the laser irradiation position in a state in which the droplet position shift is stabilized.

6.2 Configuration

The configuration of the EUV light generation system according to the third embodiment may be similar to the configuration of the EUV light generation system 11B according to the first embodiment described with reference to FIG. 12 or the configuration of the EUV light generation system 11C according to the second embodiment described with reference to FIG. 20.

6.3 Operation

Figure 21:
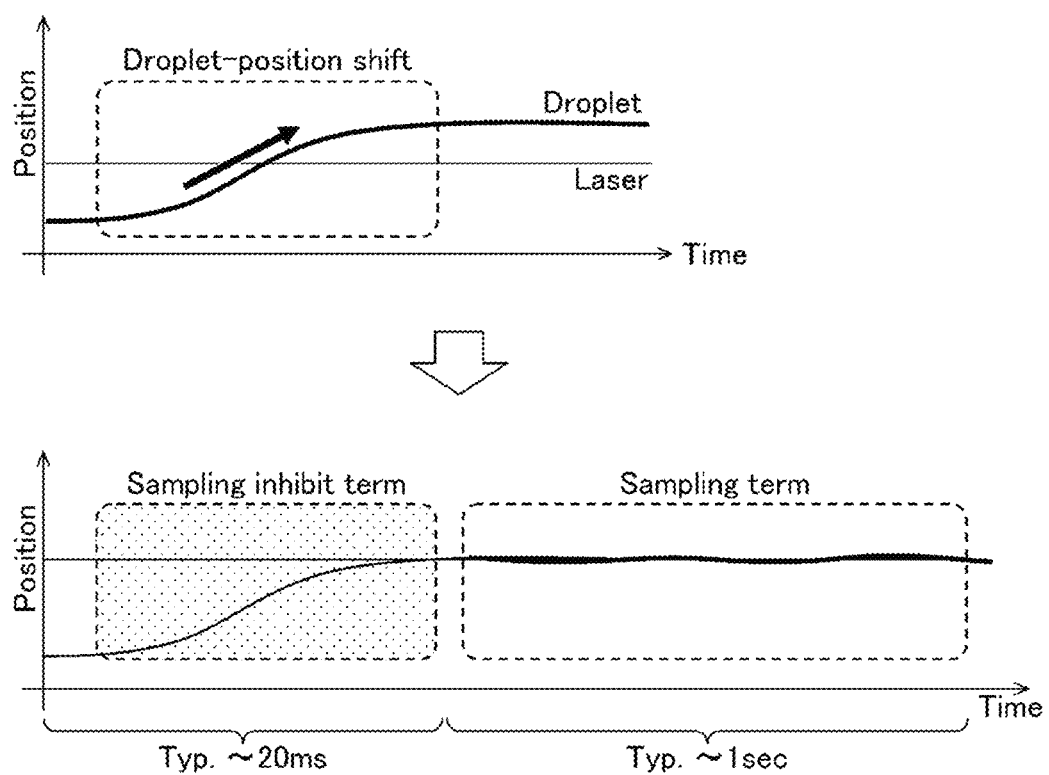
FIG. 21 shows an example of sampling that eliminates a transient period at the beginning of a burst in the laser irradiation position adjustment.

FIG. 21 shows an example of sampling that eliminates the transient period at the beginning of the burst in the laser irradiation position adjustment. The upper part of FIG. 21 is an explanatory diagram of the phenomenon of the droplet position shift at the beginning of the burst, and the lower part of FIG. 21 is an explanatory diagram showing that the laser irradiation position adjustment is performed after the droplet position shift is stabilized.

The burst pattern at the time of the initial adjustment may be divided into two stages of cold and hot, or may be hot only. The controller 5A optimizes the respective irradiation positions of the prepulse laser light 31P and the main pulse laser light 31M at each stage. The number of bursts is preferably about 3 to 10.

It is preferable that the burst ON time in the burst pattern of cold adjustment is less than 1 ms. The burst OFF time (pause period) is about 100 ms, and the duty is less than 1%. It is preferable that the burst ON time in the burst pattern of hot adjustment is equal to or more than 1 second. Then, the controller 5A performs control so as to acquire the index after 20 ms elapses from the burst ON (see the lower part of FIG. 21). Further, the burst OFF time is about 2 to 10 seconds, and the duty is less than about 30%.

For example, the controller 5A performs the process in the following procedure.

[Procedure 1: cold adjustment] The controller 5A first optimizes the respective irradiation positions of the prepulse laser light 31P and the main pulse laser light 31M with respect to the droplet DL in the cold burst pattern.

[Procedure 2: hot adjustment] Thereafter, the controller 5A optimizes the respective irradiation positions of the prepulse laser light 31P and the main pulse laser light 31M similarly in the hot burst pattern. In the hot adjustment, as shown in the lower part of FIG. 21, sampling of CE and the diffusion target characteristic value in the transient period at the beginning of the burst is prohibited, and CE and the diffusion target characteristic value are sampled in the second half of the burst. The transient period until the droplet position shift is stabilized is an example of the "predetermined period" in the present disclosure.

Here, the cold adjustment in procedure 1 may be omitted, and only the hot adjustment may be performed.

The cold burst pattern is an example of the "first burst pattern" in the present disclosure, and the cold adjustment is an example of the "first adjustment" in the present disclosure. The hot burst pattern is an example of the "second burst pattern" in the present disclosure, and the hot adjustment is an example of the "second adjustment" in the present disclosure.

6.4 Effect

By performing the hot adjustment, it is possible to optimize the irradiation position adjustment in a state close to the operation in both the wafer exposure application and the mask inspection application. Accordingly, it is possible to realize EUV light source performance that satisfies the required specification from immediately after the start of operation.

During the irradiation position adjustment, when the laser irradiation is continued at a position where the deviation with respect to the optimum position is large (shooting error), a large amount of the residual fragments Rfg is generated during this period. On the other hand, it has been found that the irradiation position can be adjusted with a small number of pulses in the cold adjustment, and the deviation between the optimum position in the cold adjustment and the optimum position in the hot adjustment is small. Therefore, by performing the hot adjustment after the cold adjustment to reduce the time of the shooting error, the generation of fragments can be minimized and contamination of the EUV light concentrating mirror 23 can be suppressed.

7. Fourth Embodiment

7.1 Configuration

Figure 22:
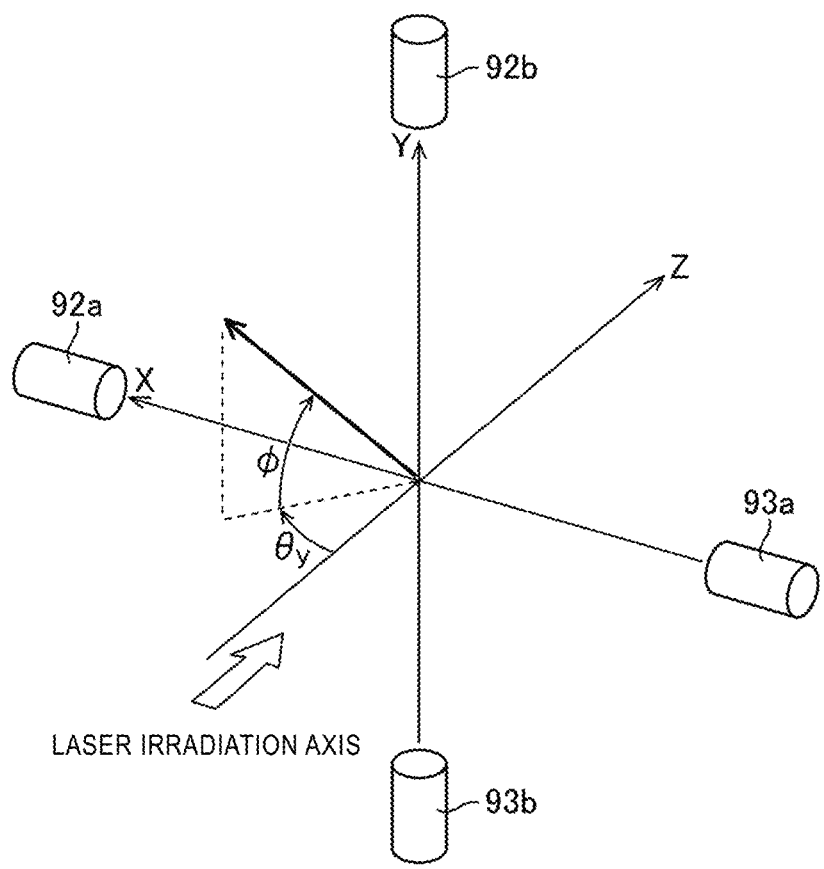
FIG. 22 shows an exemplary sensor arrangement in the EUV light generation system including two target sensors.

In FIG. 13, description is provided on an example in which the EUV light generation system 11B includes one target sensor 92, but the EUV light generation system 11B may include a plurality of target sensors. FIG. 22 shows an example of sensor arrangement with two target sensors 92a, 92b. When the two target sensors 92a, 92b are used to image the diffusion target DT from two directions, the target sensors 92a, 92b may be arranged such that the observation axes of the target sensors 92a, 92b form an angle of 90°.

For example, the target sensor 92a and an irradiation light source 93a are arranged to face each other in a direction parallel to the X axis, and the target sensor 92b and an irradiation light source 93b are arranged to face each other in a direction parallel to the Y axis. Each of the target sensors 92a, 92b may have a configuration similar to that of the target sensor 92 described with reference to FIG. 13.

7.2 Operation

When the irradiation position of the prepulse laser light 31P is optimized with respect to the droplet DL, the diffusion target DT has the following three characteristics.

[Characteristic 1] The volume of the diffusion target DT is maximized. That is, the size projected onto the imaging plane is maximized.

[Characteristic 2] The Z component of the centroid coordinate is maximized in the laser travel direction (+Z direction).

[Characteristic 3] The angle between the laser irradiation axis and the minor axis of the diffusion target DT is minimized.

In the first embodiment, size maximization of characteristic 1 is used as the index. Evaluation of the size can be realized by one target sensor 92. On the other hand, as shown in FIG. 22, when imaging is performed from two directions by using the plurality of target sensors 92a, 92b, maximization of the centroid position of characteristic 2 or minimization of the angle of characteristic 3 may be used as the index.

Therefore, the Z component of the centroid position coordinate of the diffusion target DT and the angle θ formed by the minor axis of the diffusion target DT are also included in the characteristic values of the diffusion target DT. In the case of the two-direction imaging, in maximizing the centroid position of characteristic 2, the sum or the average value of the Z coordinates in the respective two directions may be used as the index, and the irradiation position in each of the X direction and the Y direction may be adjusted so as to maximize the value.

Further, in the two-direction imaging, in minimizing the angle of characteristic 3, the angle θ, φ between the laser irradiation axis and the minor axis of the diffusion target DT in the image imaged from each of the two directions may be used as the index, and the irradiation position in each of the X direction and the Y direction may be adjusted so as to minimize the angle θ, φ.

Here, the present invention is not limited to the case of imaging from two directions, and it is possible to employ a configuration in which three or more target sensors are used to image the diffusion target DT from three or more directions.

7.3 Effect

According to the fourth embodiment, since a plurality of the target sensors 92a, 92b are arranged and the index is obtained by a plurality of images imaged from multiple directions, the state of the diffusion target DT can be more accurately grasped. As a result, the accuracy of the laser irradiation position adjustment is further improved.

8. Electronic Device Manufacturing Method

Figure 23:
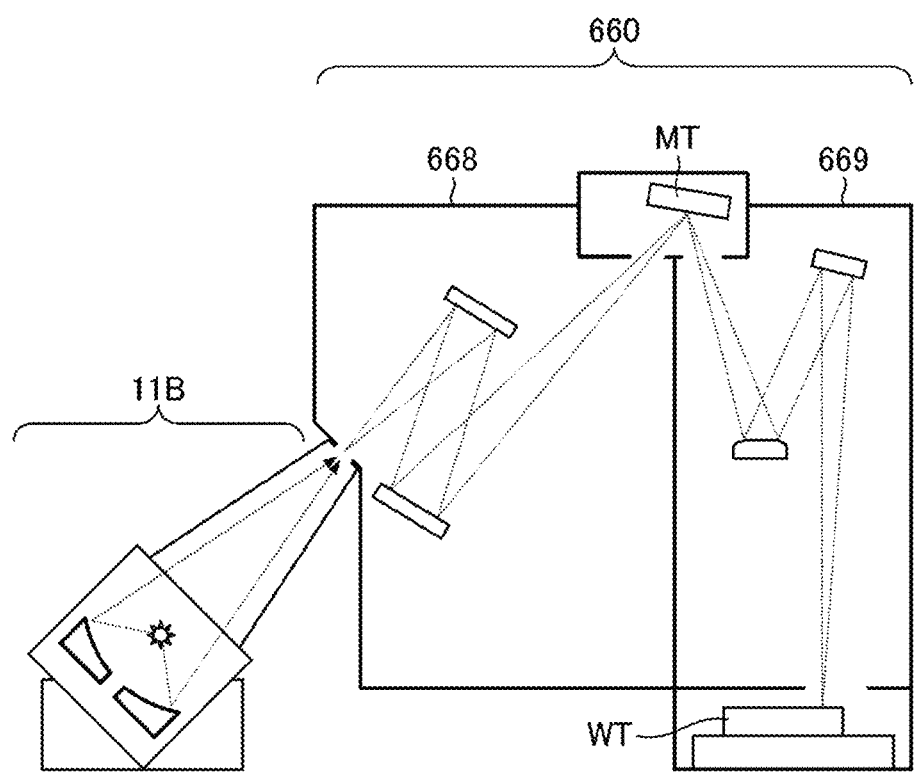
FIG. 23 schematically shows the configuration of an exposure apparatus connected to the EUV light generation system.

FIG. 23 schematically shows the configuration of an exposure apparatus 660 connected to the EUV light generation system 11B. The exposure apparatus 660 includes a mask irradiation unit 668 and a workpiece irradiation unit 669. The mask irradiation unit 668 illuminates, via a reflection optical system, a mask pattern of a mask table MT with the EUV light 252 incident from the EUV light generation system 11B. The workpiece irradiation unit 669 images the EUV light 252 reflected by the mask table MT onto a workpiece (not shown) disposed on the workpiece table WT through a reflection optical system. The workpiece is a photosensitive substrate such as a semiconductor wafer on which photoresist is applied.

The exposure apparatus 660 synchronously translates the mask table MT and the workpiece table WT to expose the workpiece to the EUV light 252 reflecting the mask pattern. After the mask pattern is transferred onto the semiconductor wafer by the exposure process described above, a semiconductor device can be manufactured through a plurality of processes. The semiconductor device is an example of the "electronic device" in the present disclosure. The EUV light generation system 11C may be used instead of the EUV light generation system 11B.

Figure 24:
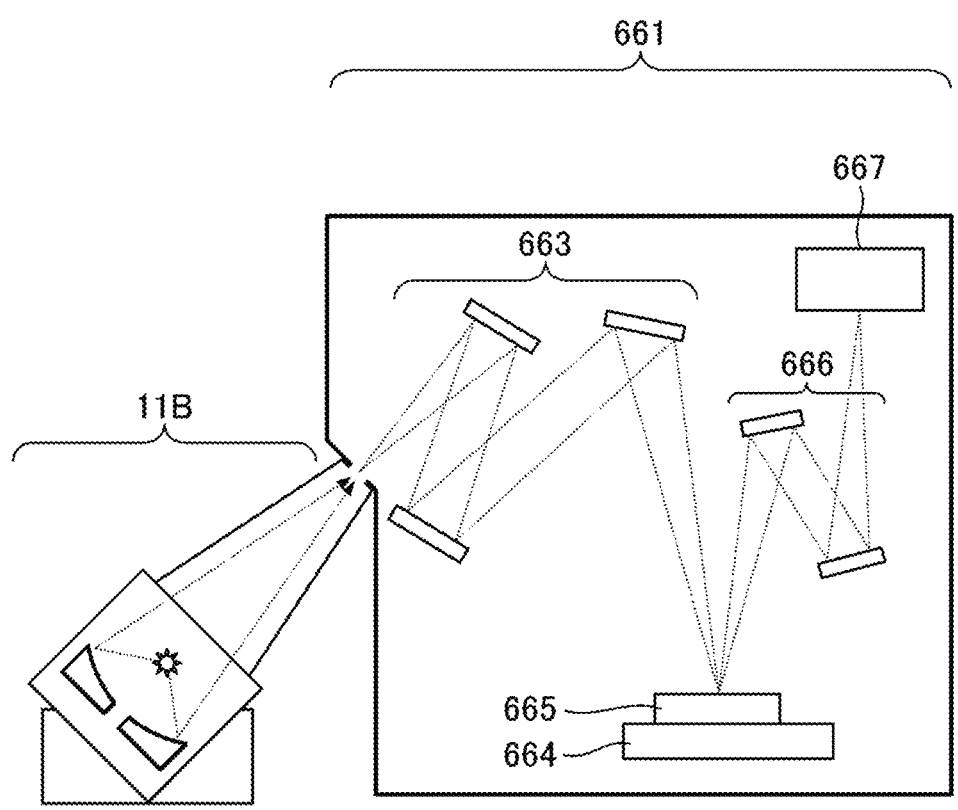
FIG. 24 schematically shows the configuration of an inspection apparatus connected to the EUV light generation system.

FIG. 24 schematically shows the configuration of an inspection apparatus 661 connected to the EUV light generation system 11B. The inspection apparatus 661 includes an illumination optical system 663 and a detection optical system 666. The illumination optical system 663 reflects the EUV light 252 incident from the EUV light generation system 11B to illuminate a mask 665 placed on a mask stage 664. Here, the mask 665 conceptually includes a mask blanks before a pattern is formed. The detection optical system 666 reflects the EUV light 252 from the illuminated mask 665 and forms an image on a light receiving surface of a detector 667. The detector 667 having received the EUV light 252 obtains an image of the mask 665. The detector 667 is, for example, a time delay integration (TDI) camera.

A defect of the mask 665 is inspected based on the image of the mask 665 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 660. In the configuration shown in FIG. 24 as well, the EUV light generation system 11C may be used instead of the EUV light generation system 11B.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An EUV light generation system, comprising
a prepulse laser device configured to output prepulse laser light to be radiated to a target supplied into a chamber;

a main pulse laser device configured to output main pulse laser light to be radiated to a diffusion target generated by the radiation of the prepulse laser light;

a first actuator configured to adjust an irradiation position of the prepulse laser light;

a second actuator configured to adjust an irradiation position of the main pulse laser light independently from the irradiation position of the prepulse laser light;

an EUV sensor configured to detect EUV energy of EUV light generated by the diffusion target being irradiated with the main pulse laser light;

a laser energy sensor configured to detect laser energy of the main pulse laser light before being radiated to the diffusion target;

a target sensor configured to image the diffusion target;

a controller configured to control, after controlling the first actuator based on a characteristic value of the diffusion target calculated from an image of the diffusion target obtained by the target sensor, the second actuator so that a ratio of the EUV energy to the laser energy detected by the laser energy sensor is increased;

a combiner configured to combine optical paths of the prepulse laser light and the main pulse laser light; and a light concentrating unit configured to concentrate, on a plasma generation region, the prepulse laser light and the main pulse laser light having the optical paths combined by the combiner, wherein the second actuator is arranged upstream of the combiner and changes a travel direction of the main pulse laser light before the optical paths are combined.

2. The EUV light generation system according to claim 1, wherein the controller adjusts the irradiation position of the prepulse laser light to search an extreme value of the characteristic value.

3. The EUV light generation system according to claim 2, wherein the controller evaluates a gradient indicating a proportion of a change in the characteristic value to a change of the irradiation position using the characteristic value at each of positions of two or more points acquired by irradiating, with the prepulse laser light, the respective positions different in the irradiation position of the prepulse laser light.

4. The EUV light generation system according to claim 3, wherein the controller determines an additional irradiation position for additional irradiation of the prepulse laser light at a position different from the respective positions of the two or more points based on the evaluation result of the gradient, and acquires the characteristic value at the additional irradiation position by the additional irradiation at the additional irradiation position.

5. The EUV light generation system according to claim 1, wherein the characteristic value includes at least one of size, slope, and a position of the diffusion target.

6. The EUV light generation system according to claim 1, wherein the controller adjusts the irradiation position of the main pulse laser light to search a maximum value of the ratio.

7. The EUV light generation system according to claim 6, wherein the controller evaluates a gradient indicating a proportion of a change in the ratio to a change of the irradiation position using the ratio at each of positions of two or more points acquired by irradiating, with the main pulse laser light, the respective positions different in the irradiation position of the main pulse laser light.

8. The EUV light generation system according to claim 7, wherein the controller determines an additional irradiation position for additional irradiation of the main pulse laser light at a position different from the respective positions of the two or more points based on the evaluation result of the gradient, and acquires the ratio at the additional irradiation position by the additional irradiation at the additional irradiation position.

9. The EUV light generation system according to claim 1, wherein the controller controls the first actuator and the second actuator based on the characteristic value and the ratio sampled after a predetermined period elapses from beginning of a burst in burst operation as eliminating the characteristic value and the ratio during the predetermined period in the sampling.

10. The EUV light generation system according to claim 9, wherein the predetermined period is several tens of ms.

11. The EUV light generation system according to claim 9, wherein the controller is configured to perform adjustment of two stages, the two stages including first adjustment in which the irradiation position of the prepulse laser light and the irradiation position of the main pulse laser light are adjusted by acquiring the characteristic value and the ratio by the burst operation in a first burst pattern, and a second adjustment in which the irradiation position of the prepulse laser light and the irradiation position of the main pulse laser light are adjusted by acquiring the characteristic value and the ratio by the burst operation in a second burst pattern after the first adjustment is performed, the first burst pattern has burst ON time less than 1 ms and duty less than 1%, and the second burst pattern has burst ON time equal to or more than 1 second and duty less than 30%.

12. The EUV light generation system according to claim 1, wherein the first actuator changes a position of the light concentrating unit.

13. The EUV light generation system according to claim 1, wherein the first actuator is arranged upstream of the combiner and changes a travel direction of the prepulse laser light before the optical paths are combined.

14. The EUV light generation system according to claim 1, further comprising a plurality of the EUV sensors arranged to surround laser irradiation axes of the prepulse laser light and the main pulse laser light concentrated by the light concentrating unit.

15. The EUV light generation system according to claim 1, wherein the target sensor includes a shutter which is opened and closed within a diffusion time of the diffusion target.

16. The EUV light generation system according to claim 1, further comprising an illumination light source arranged to face the target sensor and configured to illuminate the diffusion target.

17. The EUV light generation system according to claim 1, further comprising a plurality of the target sensors, wherein the diffusion target is imaged from a plurality of directions by the plurality of the target sensors.

18. An electronic device manufacturing method, comprising:
- generating EUV light using an EUV light generation system;
- outputting the EUV light to an exposure apparatus; and
- exposing a photosensitive substrate to the EUV light in the exposure apparatus to manufacture an electronic device,
- the EUV light generation system including:
- a prepulse laser device configured to output prepulse laser light to be radiated to a target supplied into a chamber;
- a main pulse laser device configured to output main pulse laser light to be radiated to a diffusion target generated by the radiation of the prepulse laser light;
- a first actuator configured to adjust an irradiation position of the prepulse laser light;
- a second actuator configured to adjust an irradiation position of the main pulse laser light independently from the irradiation position of the prepulse laser light;
- an EUV sensor configured to detect EUV energy of the EUV light generated by the diffusion target being irradiated with the main pulse laser light;
- a laser energy sensor configured to detect laser energy of the main pulse laser light before being radiated to the diffusion target;
- a target sensor configured to image the diffusion target; and
- a controller configured to control, after controlling the first actuator based on a size of the diffusion target calculated from an image of the diffusion target obtained by the target sensor, the second actuator so that a ratio of the EUV energy to the laser energy detected by the laser energy sensor is increased.

19. A method of manufacturing an electronic device, comprising:
- generating EUV light using an EUV light generation system;
- inspecting a defect of a mask by irradiating the mask with the EUV light;
- selecting a mask using a result of the inspection; and
- exposing and transferring a pattern formed on the selected mask onto a photosensitive substrate,
- the EUV light generation system including:
- a prepulse laser device configured to output prepulse laser light to be radiated to a target supplied into a chamber;
- a main pulse laser device configured to output main pulse laser light to be radiated to a diffusion target generated by the radiation of the prepulse laser light;
- a first actuator configured to adjust an irradiation position of the prepulse laser light;
- a second actuator configured to adjust an irradiation position of the main pulse laser light independently from the irradiation position of the prepulse laser light;
- an EUV sensor configured to detect EUV energy of the EUV light generated by the diffusion target being irradiated with the main pulse laser light;
- a laser energy sensor configured to detect laser energy of the main pulse laser light before being radiated to the diffusion target;
- a target sensor configured to image the diffusion target; and
- a controller configured to control, after controlling the first actuator based on a size of the diffusion target calculated from an image of the diffusion target obtained by the target sensor, the second actuator so that a ratio of the EUV energy to the laser energy detected by the laser energy sensor is increased.

* * * * *